United States Patent
Dong et al.

(10) Patent No.: US 9,437,318 B2
(45) Date of Patent: Sep. 6, 2016

(54) ADAPTIVE PROGRAM PULSE DURATION BASED ON TEMPERATURE

(71) Applicant: SanDisk Technologies Inc., Plano, TX (US)

(72) Inventors: Yingda Dong, San Jose, CA (US); Jiahui Yuan, Fremont, CA (US); Jian Chen, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/522,901

(22) Filed: Oct. 24, 2014

(65) Prior Publication Data
US 2016/0118131 A1    Apr. 28, 2016

(51) Int. Cl.
G11C 11/34    (2006.01)
G11C 16/34    (2006.01)
G11C 16/10    (2006.01)

(52) U.S. Cl.
CPC ........... *G11C 16/3427* (2013.01); *G11C 16/10* (2013.01); *G11C 16/3431* (2013.01); *G11C 16/3459* (2013.01)

(58) Field of Classification Search
CPC .......... G11C 16/3427; G11C 16/3431; G11C 16/10; G11C 16/3459
See application file for complete search history.

(56) References Cited

U.S. PATENT DOCUMENTS

| 6,661,724 | B1 | 12/2003 | Snyder et al. |
| 7,508,713 | B2 | 3/2009 | Sekar et al. |
| 7,551,477 | B2 | 6/2009 | Mokhlesi et al. |
| 7,551,487 | B2 | 6/2009 | Park et al. |
| 7,882,407 | B2 | 2/2011 | Abu-Rahma et al. |
| 7,978,556 | B2 | 7/2011 | Macerola et al. |
| 8,023,334 | B2 | 9/2011 | Hoei et al. |
| 8,045,384 | B2 | 10/2011 | Dong et al. |
| 8,331,183 | B2 | 12/2012 | Lee et al. |
| 8,526,233 | B2* | 9/2013 | Hemink et al. .......... 365/185.17 |
| 8,553,458 | B2 | 10/2013 | Hoei |
| 8,711,619 | B2 | 4/2014 | Patapoutian et al. |
| 8,773,927 | B2 | 7/2014 | Evans et al. |
| 8,787,099 | B2 | 7/2014 | Evans et al. |
| 2010/0110815 | A1* | 5/2010 | Lee et al. ...................... 365/211 |
| 2010/0195387 | A1 | 8/2010 | Park |

(Continued)

OTHER PUBLICATIONS

Wirth, Gilson, et al., "Single Event Transients in Logic Circuits—Load and Propagation Induced Pulse Broadening," IEEE Transactions on Nuclear Science, vol. 55, No. 6, Dec. 2008, 8 pages.

*Primary Examiner* — Richard Elms
*Assistant Examiner* — Mohammed A Bashar
(74) *Attorney, Agent, or Firm* — Vierra Magen Marcus LLP

(57) ABSTRACT

Techniques are provided for reducing program disturb in a memory device. The techniques include compensating for a temperature in the memory device to reduce the upshift in the threshold voltage (Vth) of erased-state memory cells. A minimum allowable program pulse duration increases with temperature to account for an increase in the attenuation of a program pulse along a word line. A program pulse duration which accounts for reduced channel boosting at relatively high temperatures is reduced as the temperature increases. An optimum program pulse duration is based on the larger of these durations. The optimum program pulse duration can also be based on factors such as a measure of program disturb or a memory hole width. Program disturb can also be reduced by easing the requirements of a verify test for the highest data state.

17 Claims, 20 Drawing Sheets

(56) References Cited

U.S. PATENT DOCUMENTS

2010/0322005 A1* 12/2010 Dong et al. .............. 365/185.17
2013/0223143 A1    8/2013  Cho et al.
2013/0343139 A1   12/2013  Evans et al.

* cited by examiner

Fig. 1D

```
Code in storage device (150)

boot code (151)

control code / set of instructions (160)

instructions to obtain data indicating a temperature (161)

instructions to determine a minimum allowable pulse duration based on the data, the
minimum allowable pulse duration is relatively long when the temperature is
relatively high (162)

instructions to determine a program pulse duration which is at least as long as the
minimum allowable pulse duration (163)

instructions to program a set of memory cells connected to a selected word line
using program pulses having the program pulse duration (164)
```

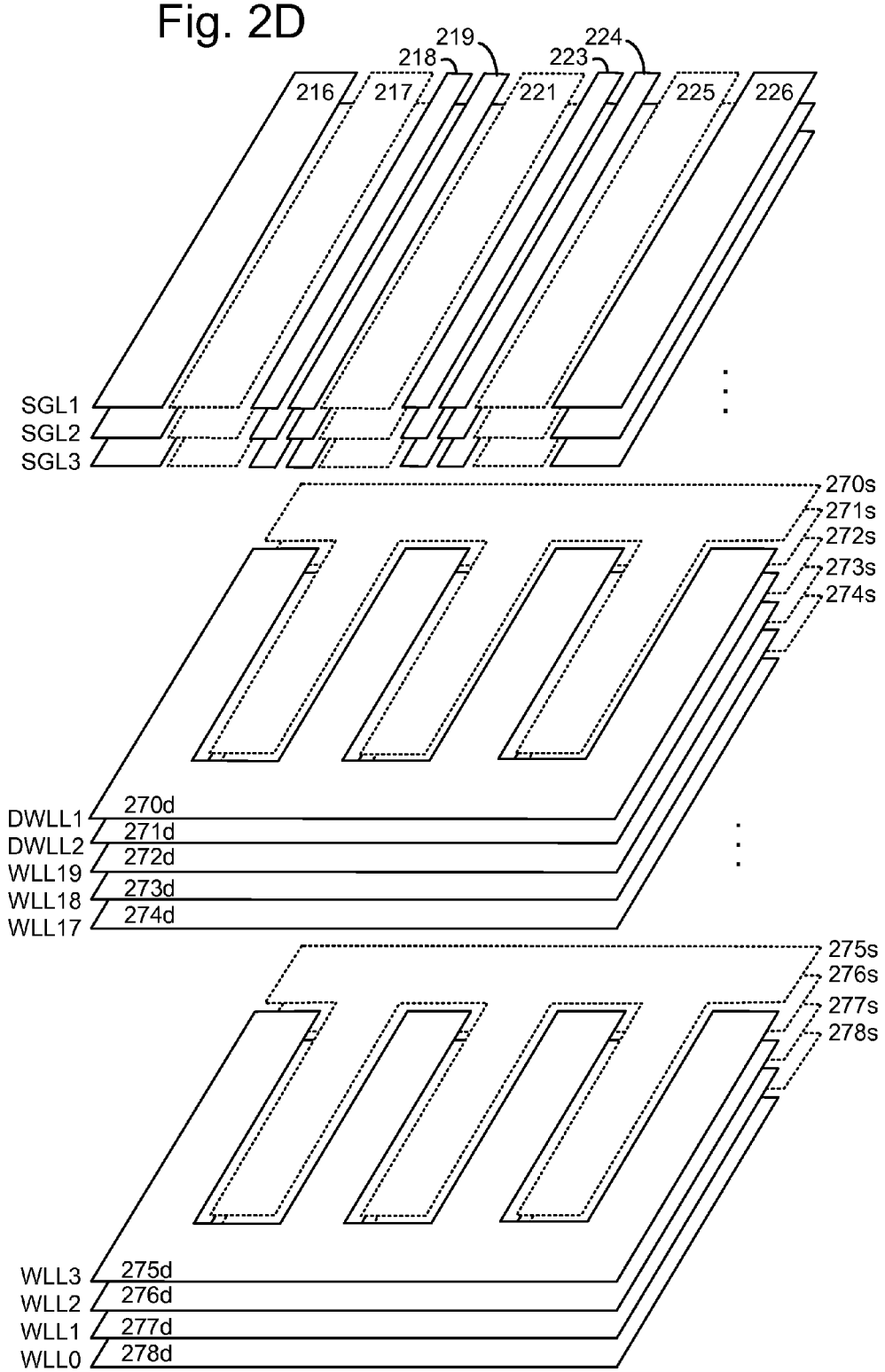

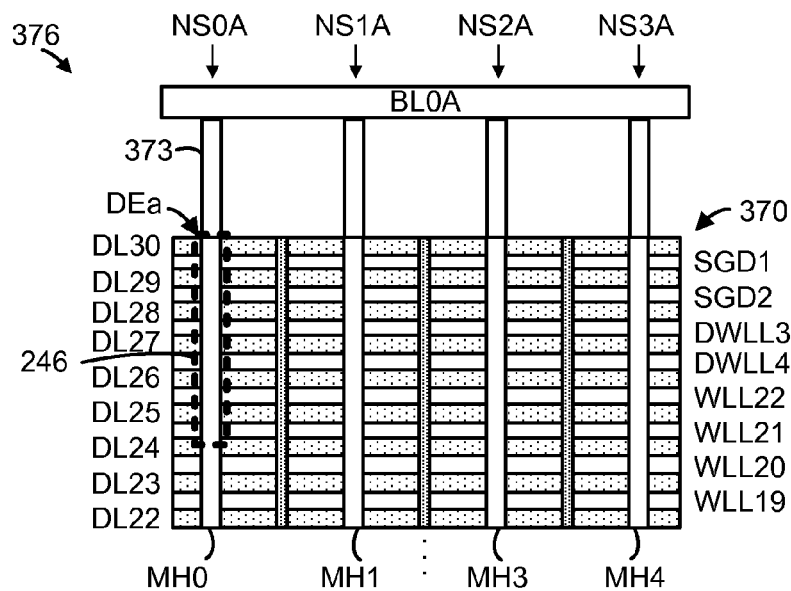
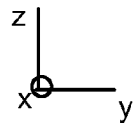
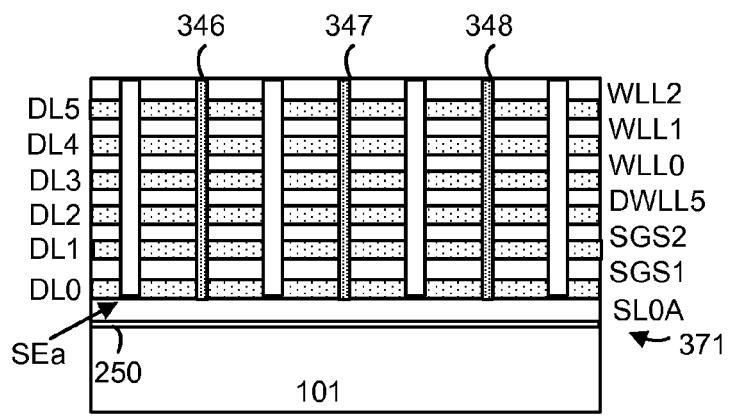

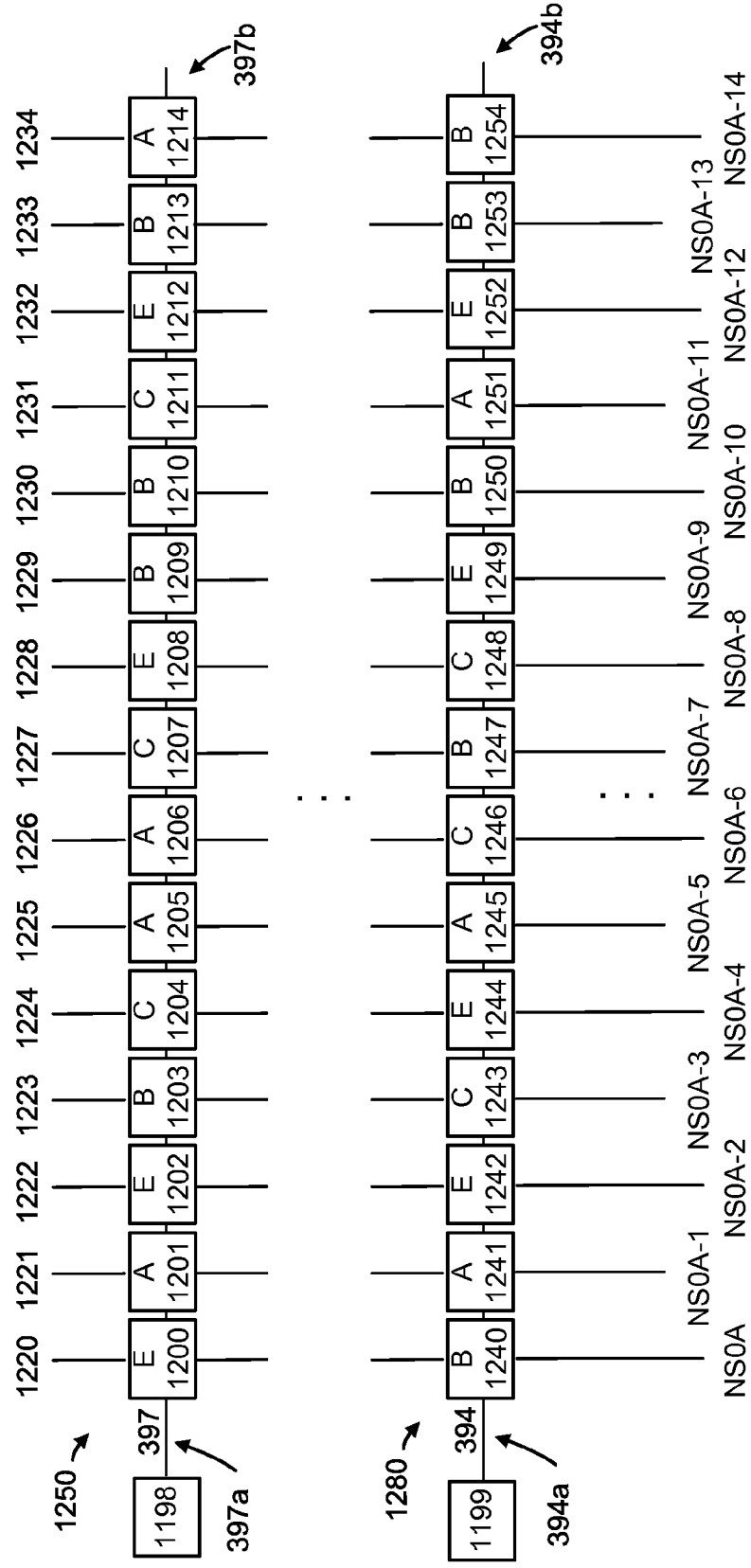

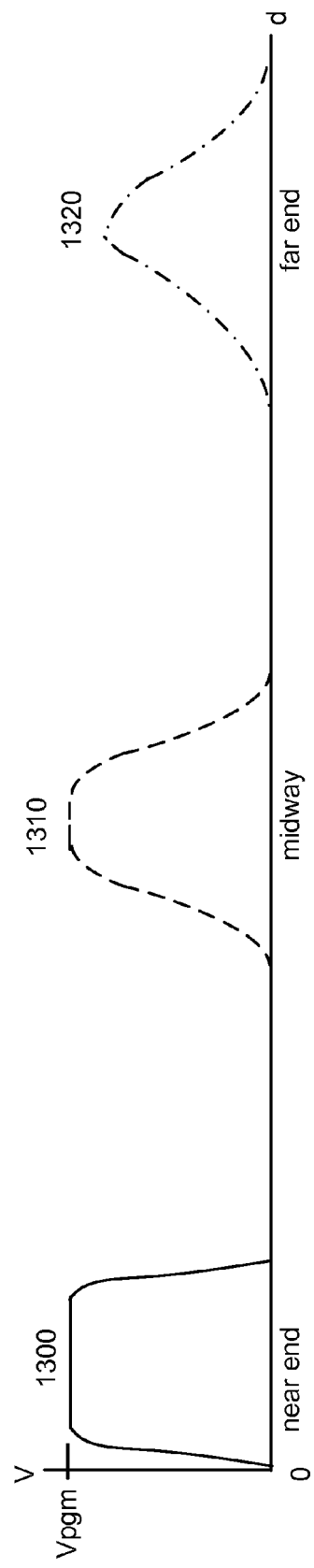
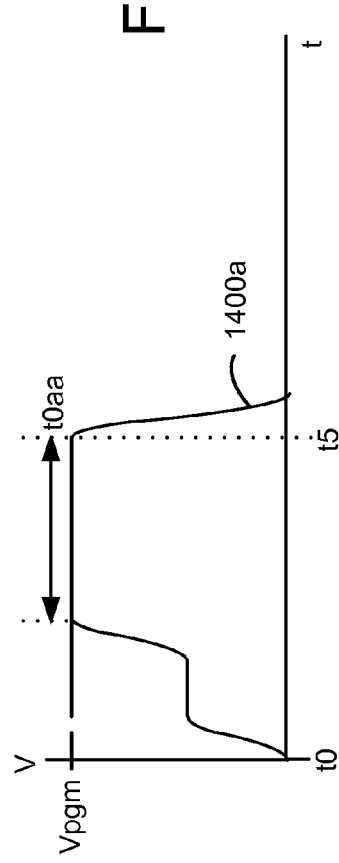
Fig. 13A
Fig. 13B

ADAPTIVE PROGRAM PULSE DURATION BASED ON TEMPERATURE

BACKGROUND

The present technology relates to operation of memory devices.

Semiconductor memory is commonly used in various electronic devices. For example, non-volatile semiconductor memory is used in personal navigation devices, cellular telephones, digital cameras, laptops and other devices. For example, one type of memory uses a floating gate to store charges which represent a data state. Floating gate memory cells can be arranged in a two-dimensional structure in which NAND strings are formed on a substrate. Another type of memory uses a charge-trapping material to store charges. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1D depicts code which may be executed by a processor.

FIG. 2D depicts an alternative view of the select gate layers and word line layers of the stack 231 of FIG. 2C.

FIG. 3C1 depicts an embodiment of a stack 376 showing a cross-sectional view of the portion 307 of FIG. 3A, along line 305.

FIG. 3C2 depicts a variation in the width of a memory hole along its height.

FIG. 12 depicts an example set of memory cells 1250 on one word line 397 and an example set of memory cells 1280 on another word line 394, consistent with of FIG. 3D.

FIG. 13A depicts a program pulse which is applied to the near end of a word line, showing attenuation and spreading of the pulse.

FIG. 13B depicts a program pulse which includes an initial step up follow by a second step up to a peak value.

DETAILED DESCRIPTION

Techniques are provided for reducing program disturb in a memory device. The techniques include compensating for a temperature in the memory device to reduce the upshift in the threshold voltage (Vth) of erased-state memory cells.

Program disturb occurs for unselected memory cells connected to a word line when selected memory cells connected to the word line are programmed. In one aspect, the application of a program pulses can inadvertently program the unselected memory cells. In another aspect, the higher Vth of programmed memory cells can increase the Vth of other memory cells due to capacitive coupling. Program disturb is greatest for erased state cells. Typically, a disturbed memory cell is in an unselected NAND string, and the channel of the unselected NAND string is boosted to combat program disturb. Program disturb causes the upper tail of the Vth distribution of the erased memory cells to increase, so that some of the disturbed erased state cells may be incorrectly read back as being in the lowest target data state, e.g., the A state. This is in conflict with the need to provide narrow Vth distributions which allow multiple data states to be stored and read back accurately.

Techniques provided herein optimize channel boosting to minimize program disturb under different cell working environments (e.g., temperatures), so that the bit error rate and reliability of a memory device can be improved. In one approach, the program pulse duration is adjusted based on temperature. Reducing the program pulse duration in proportion to an increasing temperature can avoid significant reductions in channel boosting which lead to program disturb. On the other hand, a minimum allowable program pulse duration should be provided which compensates for temperature-based changes in the RC (resistance-capacitance) time constant of a word line. In particular, the minimum allowable program pulse duration should increase with temperature. Accordingly, as temperature increases, an optimized program pulse duration may decrease to a minimum and then increase. See, e.g., FIG. 15A-15C.

Optionally, the minimum allowable program pulse duration can vary based on a measure of program disturb and a memory hole width.

Related approaches to reducing program disturb include increasing a bit ignore number and/or reducing a verify voltage used during verify tests for one or more highest target data states as temperature increases.

The following discussion provides details of the construction of example memory devices and of related techniques which address the above and other issues.

Figure 1A:
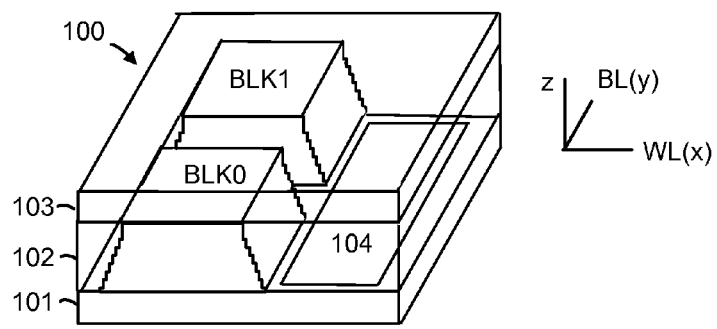
FIG. 1A is a perspective view of a 3D stacked non-volatile memory device.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
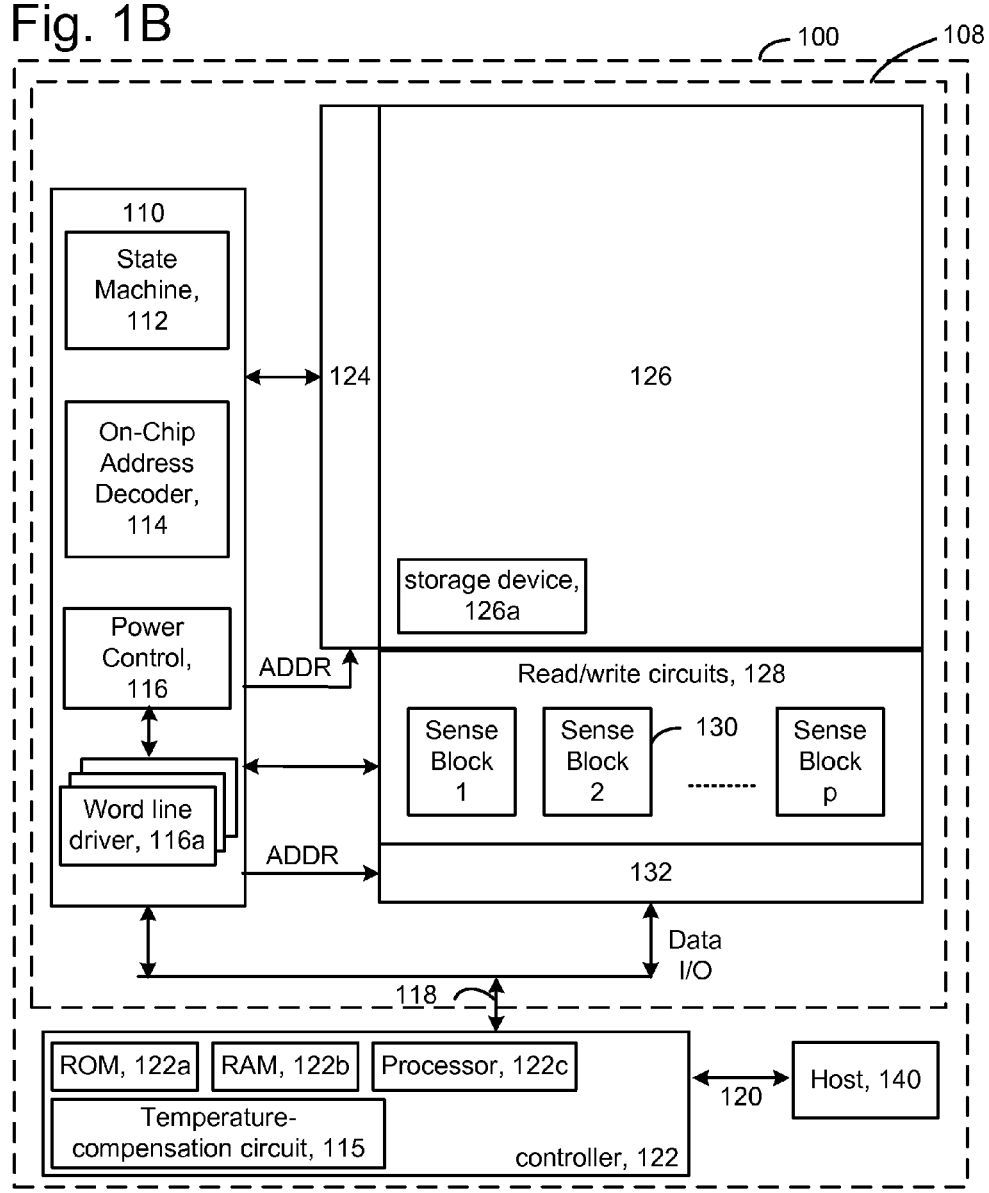
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via lines 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word lines, SGS and SGD transistors and source lines. An example set of word line drivers including a word line driver 116a is depicted. See also the word line drivers 119B and 119B in FIG. 12. The sense blocks 130 can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks 130, read/write circuits 128 and controller 122 (including processor 122c and temperature-compensation circuit 115), and so forth.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines. See FIG. 1D.

The controller 122 may also include a temperature-compensation circuit 115 which is used by the processor 122c to set temperature-based parameters such as the program pulse duration and a bit ignore number. For example, the controller may provide a digital signal to the power control module 116 to set a program pulse duration in response to the temperature-compensation circuit. The bit ignore number may be set by code within the controller, for example.

Figure 1C:
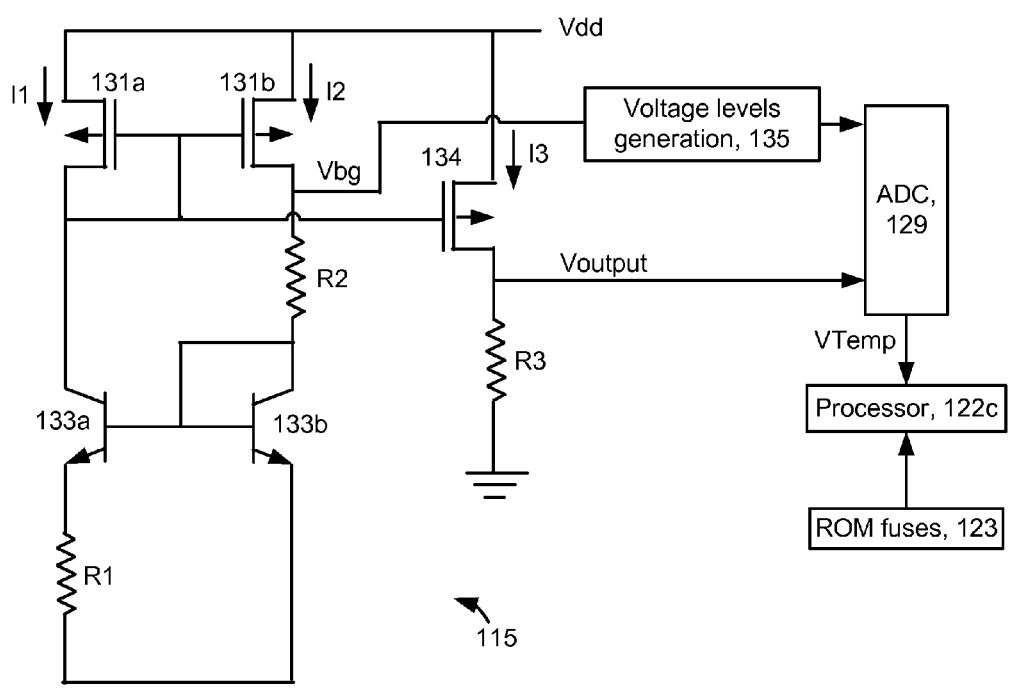
FIG. 1C depicts an example of the temperature-sensing circuit 115 of FIG. 1B.

FIG. 1C depicts an example of the temperature-sensing circuit 115 of FIG. 1B. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 1D depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instructions to obtain data indicating a temperature (161), instructions to determine a minimum allowable program pulse duration based on the data, the minimum allowable program pulse duration is relatively long when the temperature is relatively high (162), instructions to determine a program pulse duration which is at least as long as the minimum allowable program pulse duration (163), and instructions to program a set of memory cells connected to a selected word line using program pulses having the program pulse duration (164).

Figure 8:
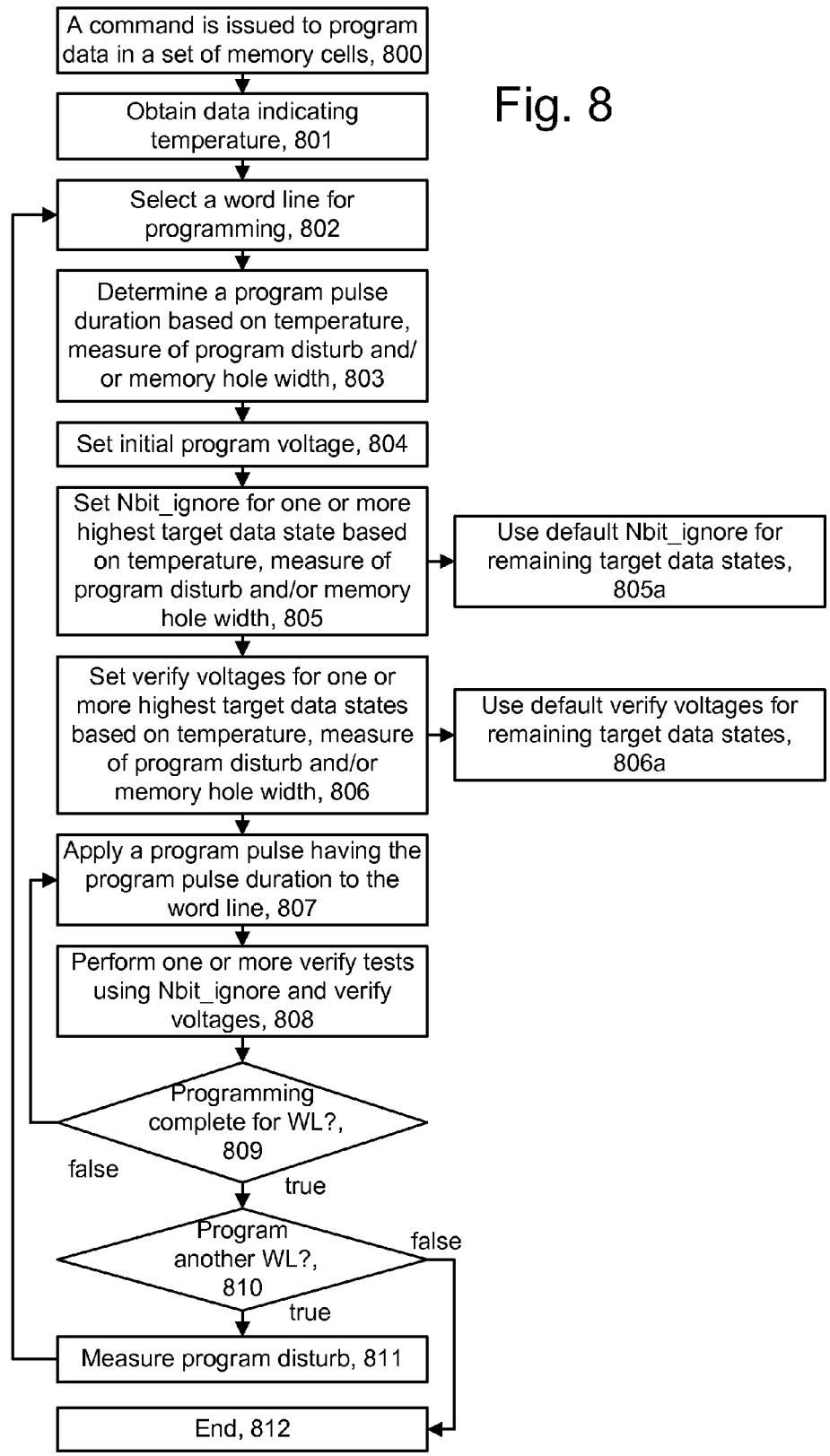
FIG. 8 depicts an example temperature-based programming operation.

The control code can include instructions to perform the functions described herein including the steps of the process of FIG. 8.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figures 2A, 2B:
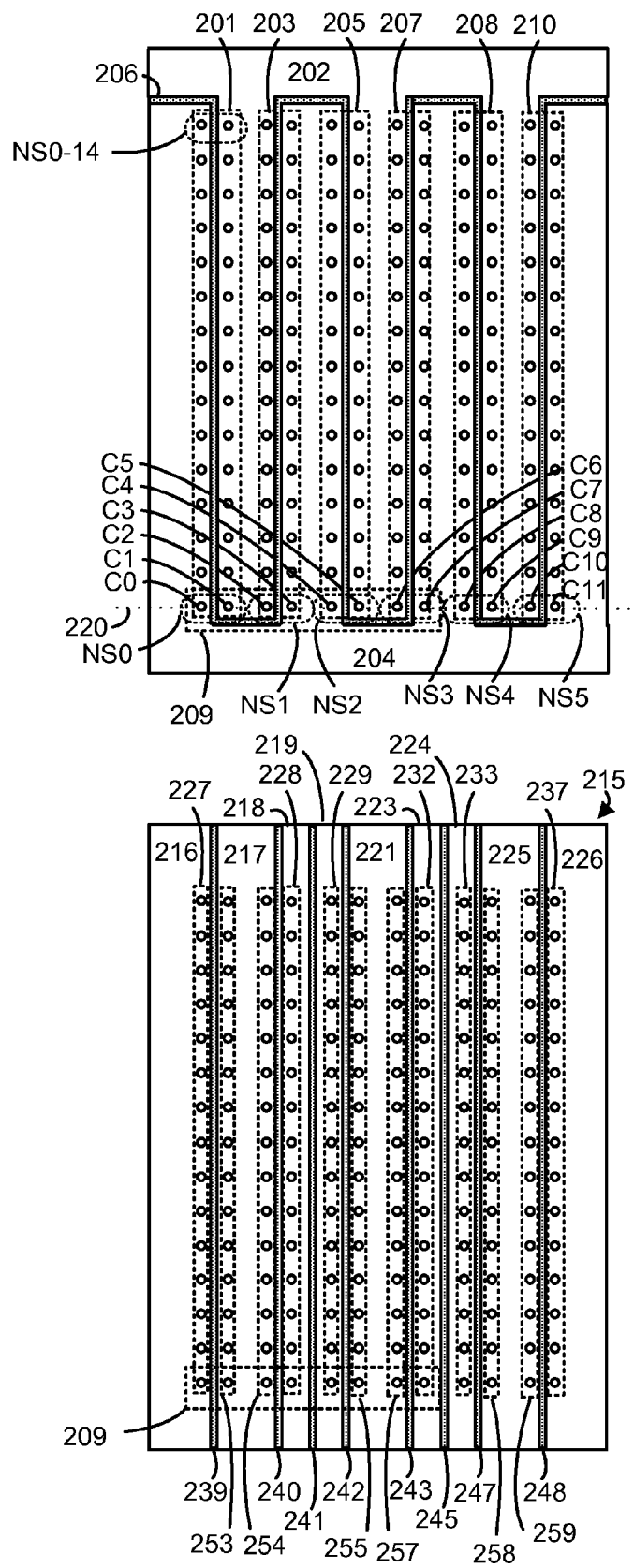
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

Figure 2C:
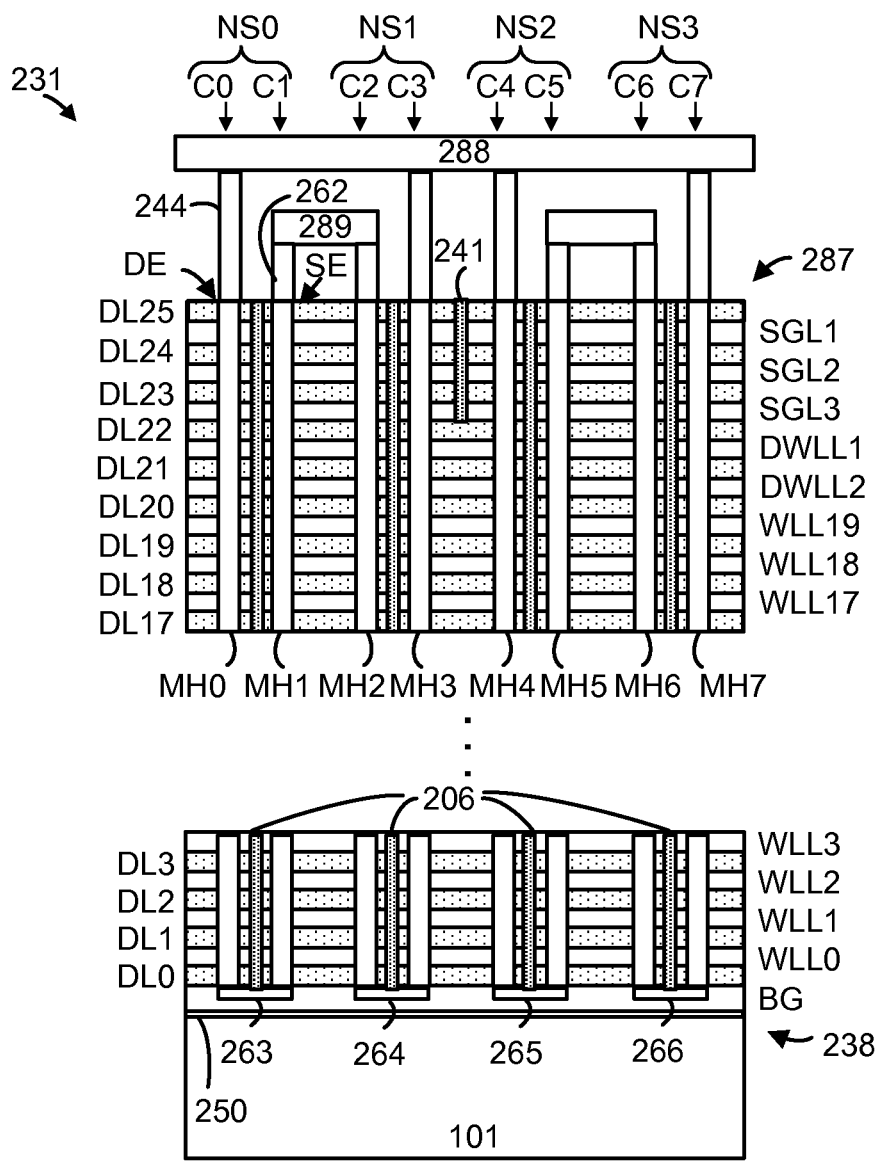
FIG. 2C depicts an embodiment of a stack 231 showing a cross-sectional view of the portion 209 of FIG. 2A, along line 220.

The view is of a representative layer among the multiple WLLs in a stack. Referring also to FIG. 2C, the stack includes alternating dielectric and conductive layers. The dielectric layers include DL0 to DL25 and may be made of SiO2, for instance. The conductive layers include a back gate layer (BGL), data-storing word line layers WLL0 to WLL19, dummy (non-data-storing) word line layers DWLL1 and DWLL2, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

Data memory cells are eligible to store user or system data while dummy memory cells are ineligible to store user or system data.

The word line layers of FIG. 2A may represent any one of the word line layers in FIG. 2C. These conductive layers may include doped polysilicon or metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. See also FIG. 2D. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000×24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD layer portions 216, 218, 219, 223, 224 and 226, respectively. Regions 253 and 254, 255 and 257, and 258 and 259 represent SGS transistors in SGS layer portions 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are provided for each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

DE denotes a drain end of NS0 and SE denotes a source end of NS0.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270d, 271d, 272d, 273d and 274d, respectively, and source-side word lines 270s, 271s, 272s, 273s and 274s, respectively. Word line 272d is the drain-side edge word line in a set of word lines. The drain-side edge word line is the word line in a set of word lines which is connected to data-storing memory cells and is closest to the drain side of a set of NAND strings. Word line 272s is the source-side edge word line in the set of word lines. The source-side edge word line is the word line in a set of word lines which is connected to data-storing memory cells and is closest to the source side of a set of NAND strings.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

Figure 3A:
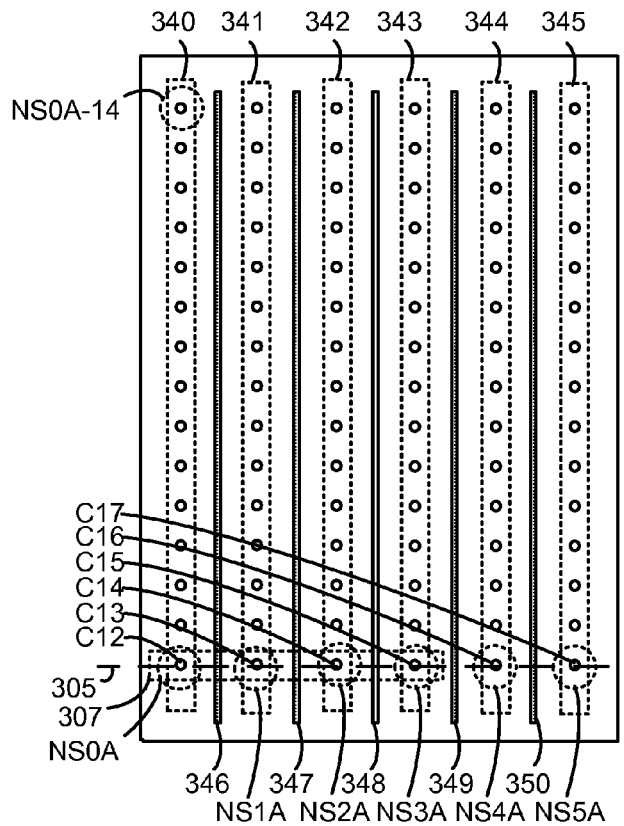
FIG. 3A depicts a top view of an example word line 394 of the block BLK0 of FIG. 1A, in a straight NAND string embodiment.

FIG. 3A depicts a top view of an example word line 394 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, NS0A-14. Additional NAND strings include NS1A, NS2A, NS3A, NS4A and NS5A.

Alternatively, the layer 394 represents an SGS layer, in which case each circle represents an SGS transistor.

Figure 3B:
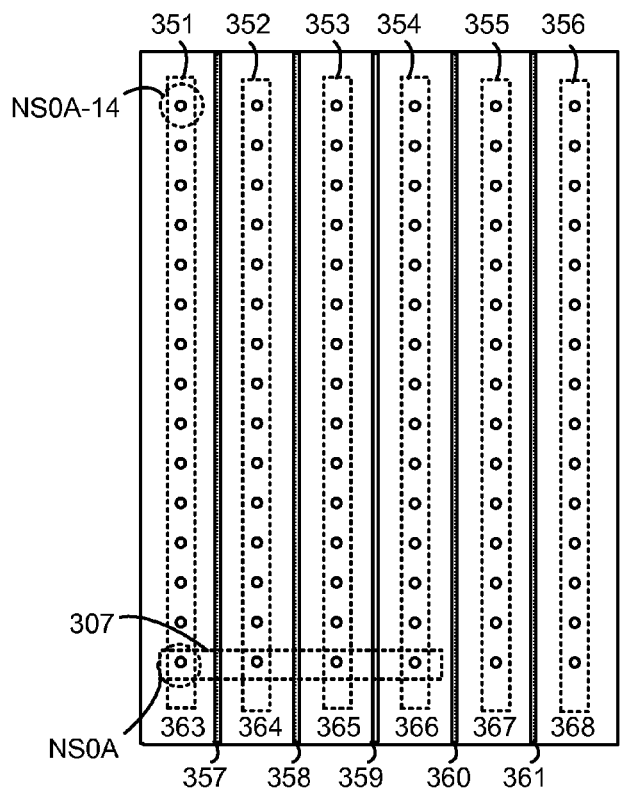
FIG. 3B depicts a top view of an example SGD layer SGD1, consistent with FIG. 3A.

FIG. 3B depicts a top view of an example SGD layer, SGD1, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305. The stack includes SGD layers SGD1 and SGD2, drain-side dummy word line layers DWLL3 and DWLL4, data word line layers WLL0 to WLL22, a source-side dummy word line layer DWLL5 and SGS layers SGS1 and SGS2. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL22, and dielectric layers, e.g., DL0-DL30, are arranged alternatingly in the stack. SGS transistors are formed in the SGS1 and SGS2 layers.

Figure 4A:
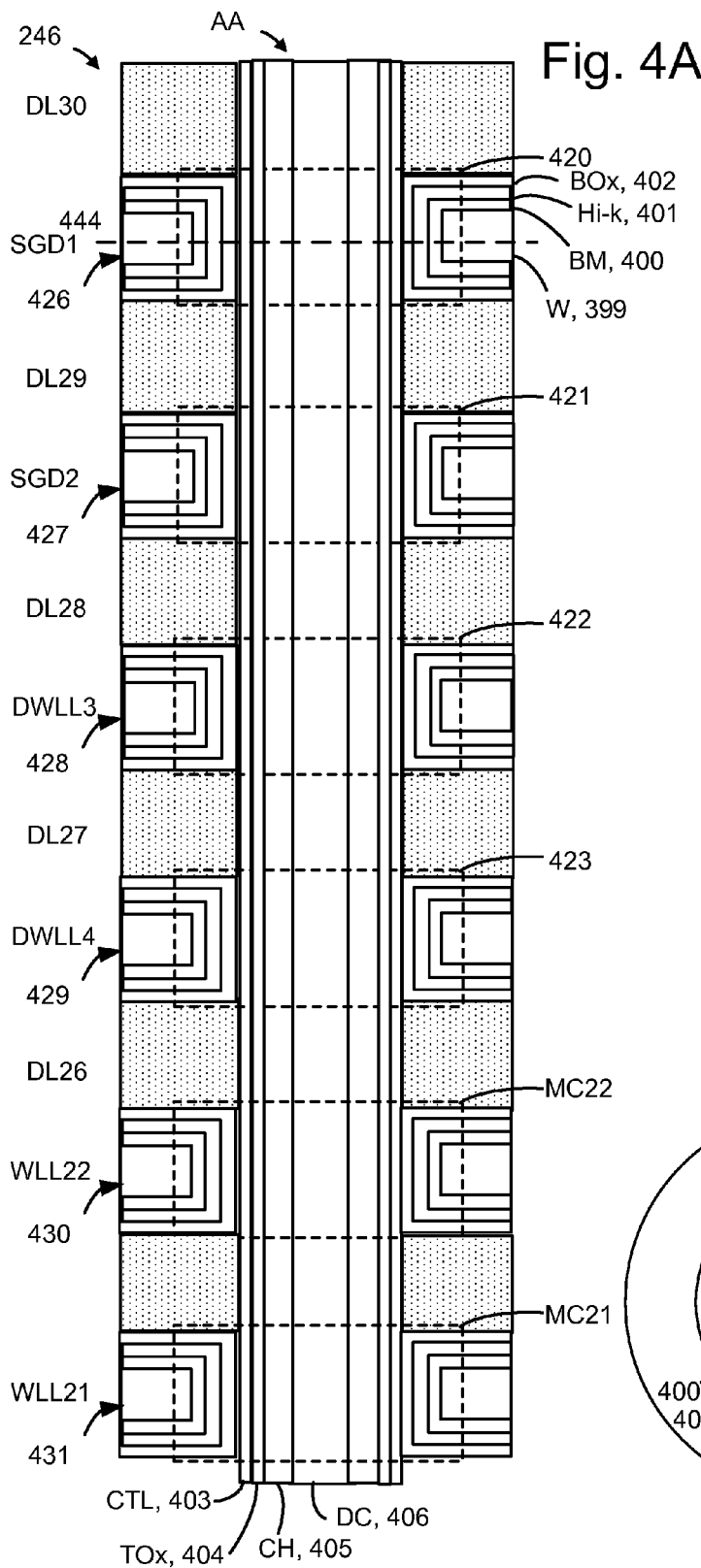
FIG. 4A depicts a view of the region 246 of FIG. 3C1, showing SGD transistors 420 and 421, dummy memory cells 422 and 423, and data-storing memory cells MC21 and MC22.

A region 246 of the stack is shown in greater detail in FIG. 4A.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-width ratio of about 25-30 is common. Typically, the width becomes progressively smaller from the top to the bottom of the memory hole. In some case, a slight narrowing occurs at the top of the hole, as depicted, so that the width becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller width memory hole, the electric field across the tunneling layer is stronger, so that the programming and erase speed is higher.

In one approach, a selected word line is in a set of word lines, each word line of a set of word lines is at a different height in the memory device and is adjacent to a portion of a vertical memory hole, a width of the vertical memory hole varies along a height (z) of the memory hole, and the program pulse duration is based on a height of the selected word line in the memory device and is relatively short when a portion of the memory hole to which the selected word line is adjacent is relatively narrow.

Figure 3D:
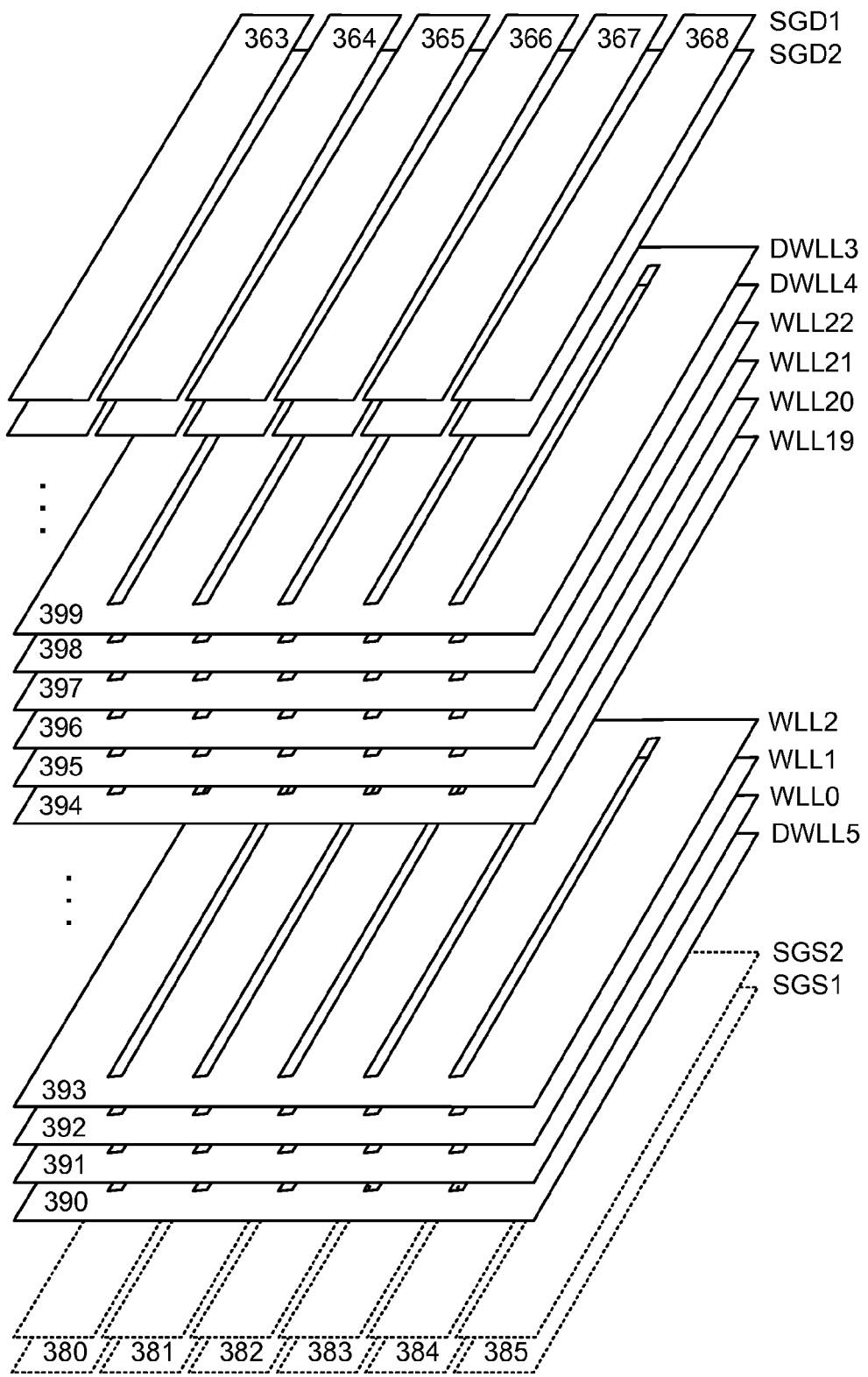
FIG. 3D depicts an alternative view of the select gate layers and word line layers of the stack 376 of FIG. 3C1.

FIG. 3D depicts an alternative view of the select gate layers and word line layers of the stack 376 of FIG. 3C1. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. Word line 397 is the drain-side edge word line for the NAND strings. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

FIG. 4A depicts a view of the region 246 of FIG. 3C1, showing SGD transistors 420 and 421, dummy memory cells 422 and 423, and data-storing memory cells MC21 and MC22. A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunnel oxide (TOx) 404 such as SiO2, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates 426 and 427 are provided for the SGD transistors 420 and 421, respectively, control gates 428 and 429 are provided for the dummy memory cells 422 and 423, respectively, and control gates 430 and 431 are provided for the data memory cells MC22 and MC21, respectively.

In another approach, all of these layers except the metal are provided in the column. Additional memory cells and SGS transistors are similarly formed in the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors. Each channel region may be annular.

In particular, to provide the select gate transistors in a non-conductive state, a relatively low voltage is applied to their control gates, resulting in a relatively lower amount of channel boosting in a region of the channel next to these select gate transistors. A region of the channel next to an edge cell will therefore also have a relatively lower amount of channel boosting. In contrast, the cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the TOx. The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

Figure 4B:
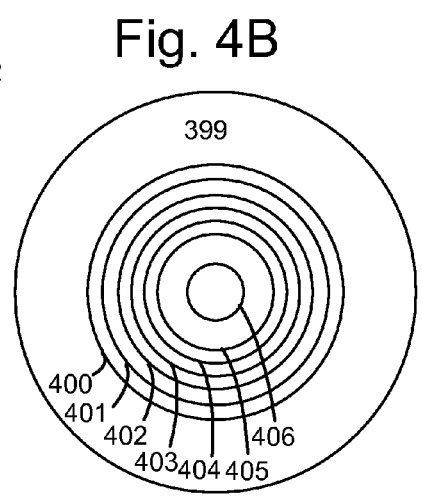
FIG. 4B depicts a cross-sectional view of the region 246 of FIG. 3C1 along line 444.

FIG. 4B depicts a cross-sectional view of the region 246 of FIG. 4A along line 444. Each layer is ring-shaped in one possible approach, except the core filler, which is a cylinder.

Figure 5A:
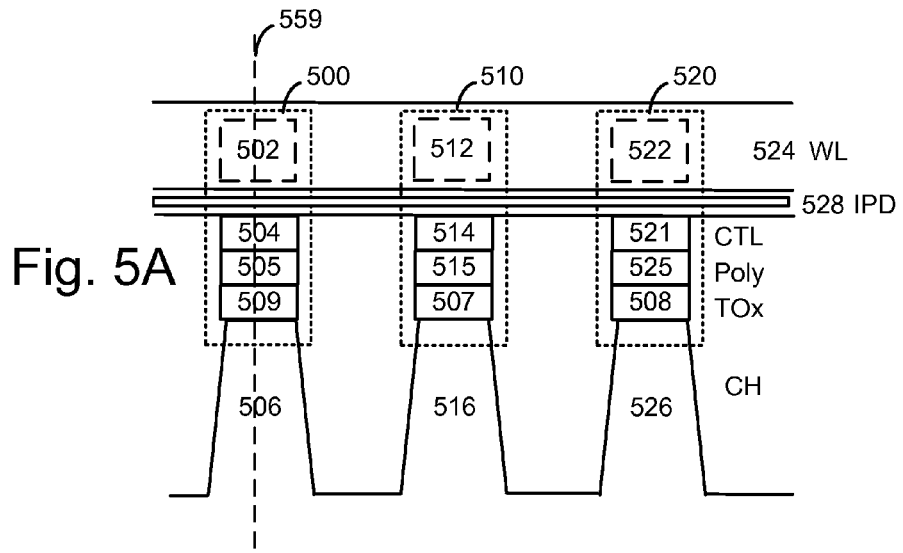
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel oxide (TOx) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
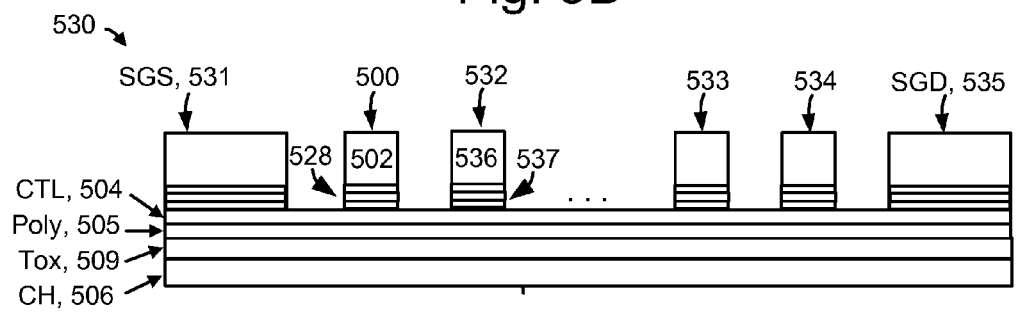
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example memory cells 500, 532, . . . , 533 and 534, and an SGD transistor 535. The SGD transistor can be biased to produce GIDL during an erase operation, as discussed. The memory cell 500 includes the control gate 502 and an IPD portion 528 above the charge-trapping layer 504, the polysilicon layer 505, the tunnel oxide layer 509 and the channel region 506. The memory cell 532 includes a control gate 536 and an IPD portion 537 above the charge-trapping layer 504, the polysilicon layer 505, the tunnel oxide layer 509 and the channel region 506.

The control gate layer may be polysilicon and the tunnel oxide layer may be silicon oxide, for instance. The IPD layer can be a stack of high-k dielectrics such as AlOx or HfOx which help increase the coupling ratio between the control gate layer and the charge-trapping or charge storing layer. The charge-trap layer can be a mix of silicon nitride and oxide, for instance. A difference between a floating gate memory cell and the flat memory cell is the height of the charge storage layer. A typically floating gate height may be about 100 nm, while a charge-trap layer can be as small as 3 nm, and the polysilicon layer can be about 5 nm. The SGD and SGS transistors have the same configuration as the memory cells but with a longer channel length to ensure that current is cutoff in an inhibited NAND string.

Figure 6:
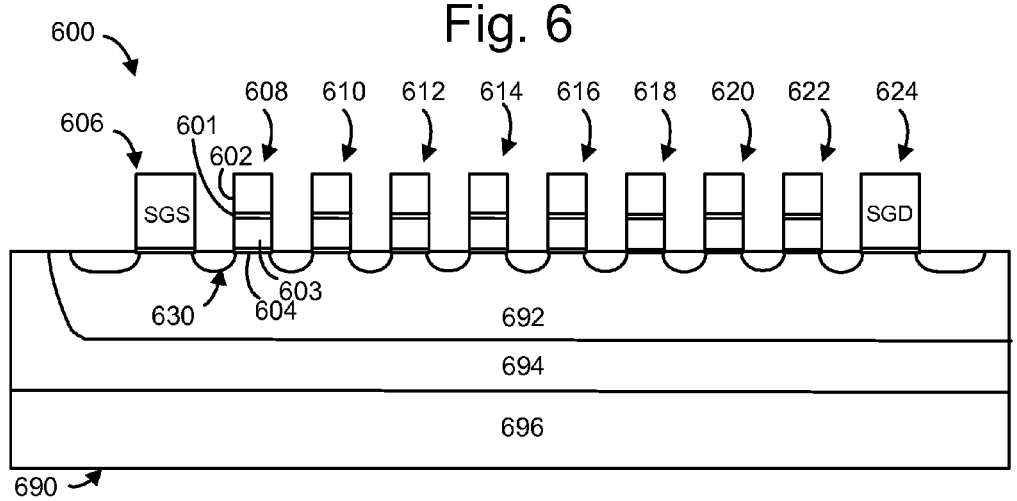
FIG. 6 depicts a cross-sectional view of a NAND string formed on a substrate.

FIG. 6 depicts a cross-sectional view of a NAND string formed on a substrate. The view is simplified and not to scale. The NAND string 600 includes a source-side select gate 606, a drain-side select gate 624, and eight memory cells 608, 610, 612, 614, 616, 618, 620 and 622, formed on a substrate 690. A number of source/drain regions, one example of which is source drain/region 630, are provided on either side of each memory cell and the select gates 606 and 624. In one approach, the substrate 690 employs a triple-well technology which includes a p-well region 692 within an n-well region 694, which in turn is within a p-type substrate region 696. The NAND string and its non-volatile memory cells can be formed, at least in part, on the p-well region.

The memory cell 608 comprises a word line portion or control gate 602, an inter-poly dielectric layer 601, a floating gate 603 and a tunnel dielectric 604.

The techniques provided herein for reducing program disturb are applicable to memory device which include, e.g., charge trapping and floating gate memory cells.

Figure 7:
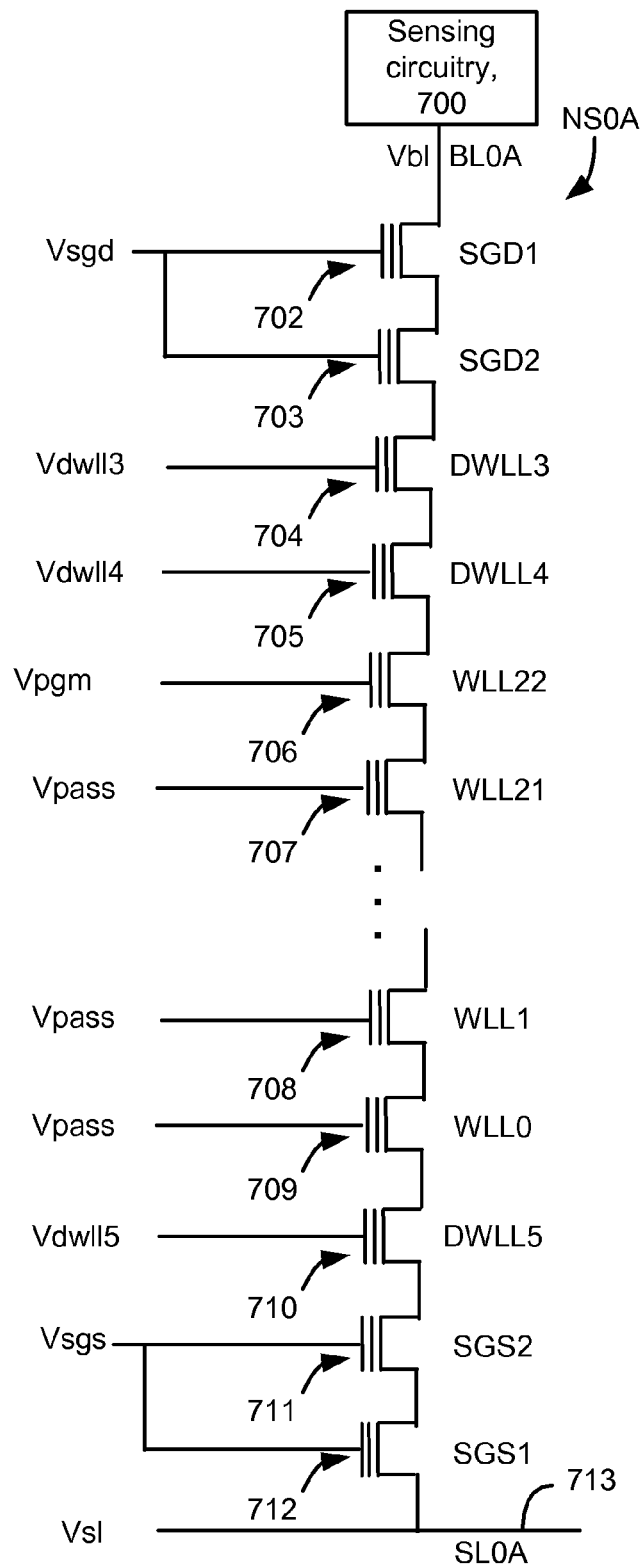
FIG. 7 depicts a circuit diagram of a NAND string consistent with the memory devices of FIGS. 2C and 3C1.

FIG. 7 depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 702 and 703, drain-side dummy memory cells 704 and 705, a drain-side memory cell 706, other memory cells 707, . . . , 708, 709, a source-side dummy memory cell 710, and SGS transistors 711 and 712. A bit line BL0A connects the drain end of the NAND string to sensing circuitry 700, which is used to sense the NAND string during operations involving the select gate transistors and the memory cells. A source line 713 is connected to a source end of the NAND string. Voltage drivers can be used to provide the voltages depicted. For example, Vsgd is applied to the control gates of the SGD transistors, which are connected to one another, and Vsgs is applied to the control gates of the SGS transistors, which are connected to one another. Vdwll3, Vdwll4 and Vdwll5 are applied to the dummy memory cells 704, 705 and 710, respectively. During programming of the drain-side word line WLL22, for example, a program pulse Vpgm is applied to the drain-side word line WLL22 and a pass voltage, Vpass, is applied to the other word lines WLL0-WLL21. Vbl is the bit line voltage and Vsl is the source line voltage.

FIG. 8 depicts an example temperature-based programming operation. At step 800, a command is issued to program data in a set of memory cells. For example, a controller may provide such a command in response to a command from a host device to store data. Prior to the command to program data, the memory cells in a block are erased using a common erase verify voltage (Vv_erase). Step 801 includes obtaining data indicating temperature, such as discussed in connection with FIG. 1C. Step 802 includes selecting a word line for programming. In some cases, data is programmed according to a word line programming order starting at a source-side word line of a block and proceeding one word line at a time until all data has been programmed partway through the block or until memory cells of a final, drain-side word line of the block has been programmed.

Step 803 includes determining a program pulse duration based on temperature, a measure of program disturb and/or memory hole width. Regarding determining a program pulse duration based on temperature, see, e.g., FIG. 15A-15C. Regarding determining a program pulse duration based on a measure of program disturb, see, e.g., FIG. 15D. Regarding determining a program pulse duration based on a memory hole width, see, e.g., FIG. 15A.

Step 804 includes setting an initial program voltage, Vpgm_init. See, e.g., FIG. 8. Step 805 includes setting Nbit_ignore for one or more highest target data states based on temperature, a measure of program disturb and/or memory hole width. See, e.g., FIG. 16A to 16D. Step 805a comprises using a default Nbit_ignore for the remaining target data states. See, e.g., FIG. 16A to 16D. Step 806 includes setting verify voltages for one or more highest target data states based on temperature, a measure of program disturb and/or memory hole width. Step 806a comprises using default verify voltages for the remaining target data states. See, e.g., FIGS. 10A-10C, 11 and 17.

Step 807 includes applying a program pulse having the program pulse duration to the currently selected word line. Step 808 includes performing one or more verify tests using Nbit_ignore and the verify voltages. A decision step 809 determines if programming is completed for the currently-selected word line (WL). If decision step 809 is false, step 807 is repeated. The program pulse amplitude may be stepped up in each program loop, as in FIG. 9.

If decision step 809 is true, decision step 810 determines if another word line is to be programmed. If decision step 810 is false, the programming operation ends at step 812. If decision step 810 is true, step 811 involves measuring program disturb. See, e.g., FIGS. 10A and 10B. Step 802 is then repeated, where a next word line is selected for programming. The measure of program disturb from one word line can be used to set Nbit_ignore or verify voltages for another word line.

Figure 9:
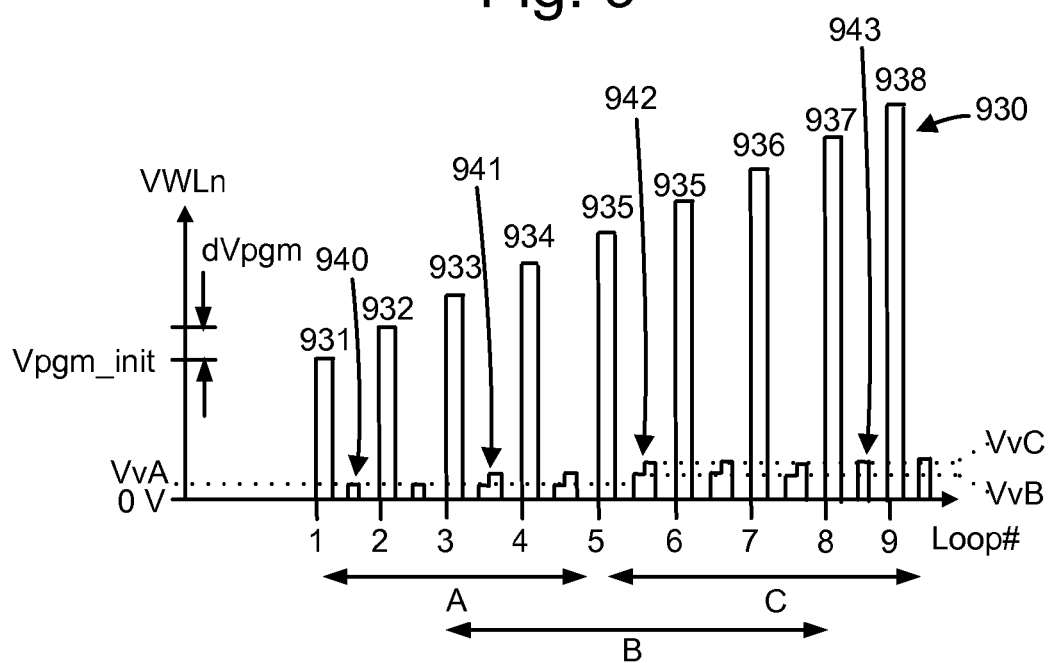
FIG. 9 depicts voltages applied to a word line in a programming operation, consistent with FIG. 8.

FIG. 9 depicts voltages applied to a word line in a programming operation, consistent with FIG. 8. The horizontal axis depicts time or program loops and the vertical axis depicts VWLn, the voltage on an nth word line which is selected for programming. The programming pass comprises a waveform 930 which includes program pulses and verify voltages in program loops. Each program loop comprises a program pulse and one or more verify voltages.

The programming pass may step up Vpgm in each program loop, after the first loop, in a process referred to as incremental step pulse programming (ISPP). The step size is dVpgm. The programming pass may perform verify tests based on the program loop. For example, the A, B and C state cells are verified in loops 1-4, 3-7 and 5-9, respectively. An example verify waveform 940 comprises an A state verify voltage at VvA. An example verify waveform 941 comprises A and B state verify voltages at VvA and VvB, respectively. An example verify waveform 942 comprises B and C state verify voltages at VvB and VvC, respectively. An example verify waveform 943 comprises a C state verify voltage at VvC. The program pulses 931 (with amplitude Vpgm_init), 932, 933, 934, 935, 936, 937 and 938 are also depicted.

In FIGS. 10A, 10B, 10C and 11, the horizontal axis depicts Vth and the vertical axis depicts a number of memory cells, on a logarithmic scale.

Figure 10A:
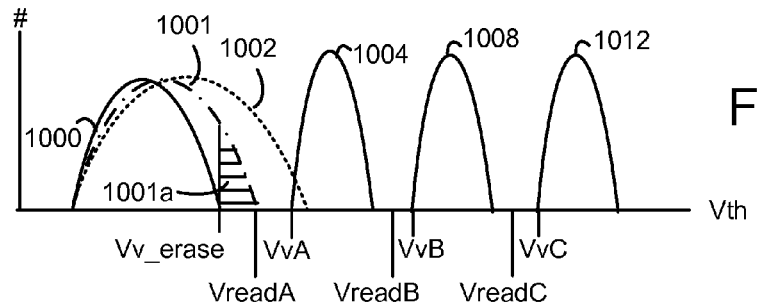
FIG. 10A depicts Vth distributions of a set of memory cells after programming to three target data states, including an increase in the Vth of erased state memory cells due to program disturb.

FIG. 10A depicts Vth distributions of a set of memory cells after programming to three target data states, including an increase in the Vth of erased state memory cells due to program disturb. A set of memory cells is erased using the verify voltage of Vv_erase to arrive at the Vth distribution 1000. The set of memory cells is subsequently programmed from the erased state to target data states of A, B and C using verify voltages of VvA, VvB and VvC, respectively, in a four state memory device. In other cases, eight, sixteen or more data states are used. The erased state and the A, B and C states are represented by Vth distributions 1000, 1004, 1008 and 1012, respectively. Read voltages of VreadA, VreadB and VreadC are also depicted.

In one approach, the programming involves a single pass in which the memory cells transition from the erased state to the target data state. This programming, also referred to as full sequence programming, minimizes programming time but can result in a high level of program disturb.

During programming, program disturb causes the Vth distribution of the erased state to increase to the Vth distribution 1002, in an example where the programming does not account for temperature. The program disturb can be severe enough to cause the upper tail of the Vth distribution to shift up above VreadA. As a result, some of the erased state memory cells will be incorrectly read back as A state cells. However, by accounting for temperature as discussed herein, the upshift in the Vth distribution can be lowered to the Vth distribution 1001, in which a region 1001a represents a number of memory cells in the upper tail of the erased state distribution. This is a number of erased state memory cells for which Vth>Vv_erase.

This is an example of a method in which the measurement of the upper tail is based on a number of memory cells in a set of memory cells connected to another word line (other than the currently selected word line being programmed) having a threshold voltage above a demarcation voltage (e.g., Vv_erase).

Figure 10B:
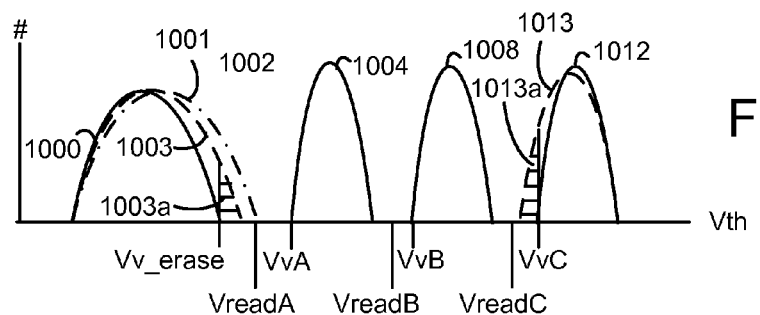
FIG. 10B depicts Vth distributions of a memory cells similar to FIG. 10A, but where the program disturb of the erased state memory cells is reduced due to an increase in a bit ignore number for the highest target data state.

FIG. 10B depicts Vth distributions of a memory cells similar to FIG. 10A, but where the program disturb of the erased state memory cells is reduced due to an increase in a bit ignore number for the highest target data state. The bit ignore number (Kbit_ignore) for a target data state is a number of the memory cells which are to be programmed to that target data state which are permitted to fail a verify test of that target data state while still allowing the programming to be successfully completed. That it, it is a number of memory cells with a Vth below the verify voltage of the target data state.

Due to the reduction of Nbit_ignore, the lower tail of the Vth distribution of the C state memory cells is downshifted compared to FIG. 10A so that the Vth distribution 1013 is obtained. A region 1013a represents a number of memory cells in the lower tail of the C state distribution. This is a number of C state memory cell for which Vth<VvC. Since some of the C state memory cells are locked out from programming even though Vth<VvC, there will be fewer high-amplitude program pulses required to complete the program operation. As a result, the amount of program disturb is reduced as indicated by the erased state distribution 1003 compared to the distribution 1001. A region 1003a represents a number of memory cells in the upper tail of the erased state distribution. This number is smaller than the number in the region 1001a.

Figure 10C:
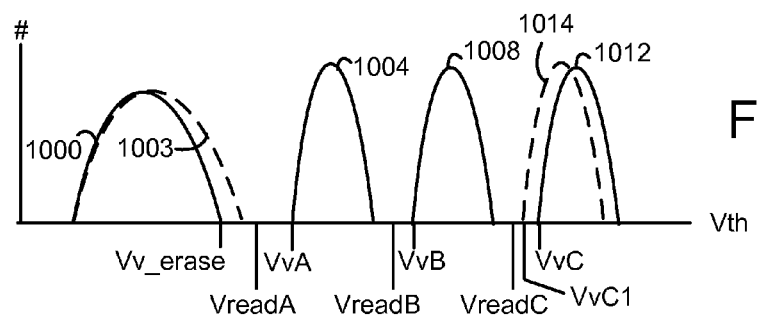
FIG. 10C depicts Vth distributions of a memory cells similar to FIG. 10A, but where the program disturb of the erased state memory cells is reduced due to a reduction in a verify voltage for the highest target data state.

FIG. 10C depicts Vth distributions of a memory cells similar to FIG. 10A, but where the program disturb of the erased state memory cells is reduced due to a reduction in a verify voltage from VvC to VvC1 for the highest target data state. As an alternative or addition to increasing the bit ignore number for the highest target data state, the verify voltage for the highest target data state can be adjusted. For example, the verify voltage can be lowered when the temperature, the measure of program disturb, or the memory hole width, is relatively high. See FIG. 17. The Vth distribution of the C state memory cells is downshifted compared to FIG. 10A so that the Vth distribution 1014 is obtained. The C state memory cells can still be read back correctly as long as the reduction in VvC is not too great. ECC decoding can be used to correctly read back any C state memory cells for which Vth<VvC.

Figure 11:
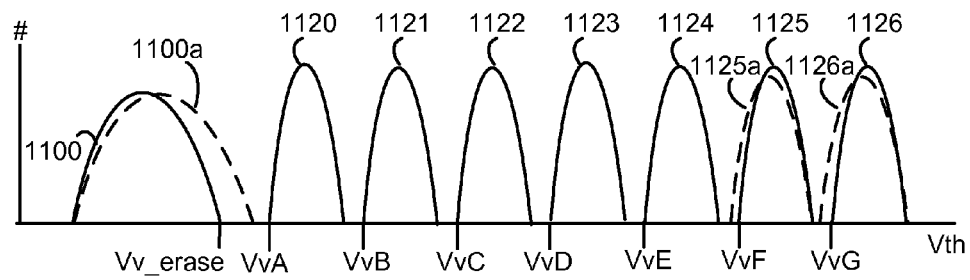
FIG. 11 depicts Vth distributions of a set of memory cells after programming to seven target data states, showing a reduced program disturb of the erased state memory cells based on an increase in a bit ignore number for the first and second highest target data states.

FIG. 11 depicts Vth distributions of a set of memory cells after programming to seven target data states, showing a reduced program disturb of the erased state memory cells based on an increase in a bit ignore number for the first (e.g., G state) and second (e.g., F state) highest target data states. As mentioned in connection with FIG. 10B, increasing the bit ignore level for the highest target data state can reduce the number of high-amplitude program pulses in a programming operation. Similarly, increasing the bit ignore level for a second highest target data state or even other next higher target data state can also reduce the number of high-amplitude program pulses. In fact, sometimes an F state memory cell, for example, can be equally hard to program, or harder to program, than a G state memory cell.

The memory cells are initially erased to provide the Vth distribution 1100 and subsequently programmed to provide the Vth distributions 1120, 1121, 1122, 1123, 1124, 1125 and 1126 for the A, B, C, D, E, F and G states, respectively, using verify voltages VvA, VvB, VvC, VvD, VvE, VvF and VvG, respectively. The erased state cells transition to a Vth distribution 1100a due to program disturb. However, a larger upshift is avoided by lowering the bit ignore numbers for the G state, the highest target data state and the F state, the second highest target data state. For the G state, the Vth distribution 1126a is obtained instead of the Vth distribution 1126. For the F state, the Vth distribution 1125a is obtained instead of the Vth distribution 1125. The lower tails of the Vth distributions are shifted down. As an alternative or addition to increasing the bit ignore number for the first and second highest target data states, the verify voltages for these target data states can be lowered. Moreover, it is also possible to reduce the bit ignore number and/or the verify voltage for additional higher target data states. The reduction can be in proportion to the verify level of the data state.

FIG. 12 depicts an example set of memory cells 1250 on one word line 397 and an example set of memory cells 1280 on another word line 394, consistent with of FIG. 3D. The set of memory cells 1250 includes memory cells 1200-1214, and the set of memory cells 1280 includes memory cells 1240-1254. The memory cells are in NAND strings NS0A to NS0A-14 which are connected to associated bit lines 1220-1234, respectively. For example, the memory cells 1240-1254 can be in the region 340 of FIG. 3A. The memory cells are in the E (erased), A state, B state or C state as indicated according to a random distribution of the states as depicted. Each memory cell connected to a word line can be in a respective NAND string, for instance, which is associated with a different bit line.

Additionally, each word line is driven with a program pulse from one end. For example, word line 394 has a near end 394a at which it is driven and a far end 394b at which it is not driven. Word line 397 has a near end 397a at which it is driven and a far end 397b at which it is not driven.

In one case, the word line 397 is a selected word which is programmed based on a measure of program disturb from the another word line 394.

FIG. 13A depicts a program pulse which is applied to the near end of a word line, showing attenuation and spreading of the pulse. The vertical axis depicts voltage and the horizontal axis depicts a distance along the word line from a near end to a voltage driver. The program pulse propagates along the word line from the driven end according to an RC time constant. The resistance and capacitive load of the word line causes the pulse to attenuate and spread out as it approaches the far end of the word line. For example, the pulse 1300 represents the program pulse at the near end and has a generally square wave shape. The pulse 1310 represents the program pulse midway along the word line and has a more rounded shape but still reaches the same peak level as the pulse 1300. The pulse 1320 represents the program pulse at the far end of the word line and may be attenuated so much that it does not reach the same peak level as the pulse 1300. Due to this attenuation, memory cells at the far end of the word line will need more high-amplitude program pulses to reach their target data states than the other memory cells of the word line. These program pulse will cause extra program disturb for the other memory cells. To avoid this problem, the minimum allowable program pulse duration can be set based on the RC delay of the word line, which controls the propagation characteristics along the word line.

On the other hand, when the program pulse is relatively long, channel boosting potential decreases over the course of the program pulse as a relatively large number of electrons are generated inside the channel. For example, in a 2D NAND memory device, the silicon substrate is directly beneath the boosted channel, and a high electric field exists in the deep depletion region between the boosted channel and the substrate. In a 3D NAND memory device, this depletion region does not exist because of the floating-body transistor configuration in which the polysilicon channel is adjacent to the tunnel oxide. Therefore, a high electric field exists along the polysilicon channel layer of the NAND string. Electrons are generated at the high-field regions, and once they move to the boosted channel, they lower the boosting potential.

The program pulses generally have an exponential rise, followed optionally a period at a relatively constant level, and then an exponential decay. Specifically, when the programming pulse 1300 is supplied to the near side of the word line, it encounters an RC circuit. At a distance d from the near end, the value of RC is RC(d). The voltage V(d,t) is based on a charging up and then a discharging of a portion of the word line between d and the near end as a function of time t. By modeling the programming pulse 1300 as rectangular programming pulse, the charging occurs according to an exponential function with the rising edge of the pulse and the discharging occurs according to an exponential function with the falling edge of the pulse. The charging up is given by: $V(d,t)=Vpgm [1-exp(-t/RC(d))]$ and the discharging is given by: $V(d,t)=Vpgm \times exp(-t/RC(d))$. For example, after one or two units of time constant RC, the word line will be charged to 63.2% or 86.5%, respectively, of Vpgm. A large value of RC results in slower charging and discharging. Furthermore, the propagation delay at a distance d along the word line is about one half RC(d).

Due to the above-mentioned concerns with a program pulse which is too long or too short, there is an optimum program pulse duration to minimize program disturb. The pulse duration should be short enough to minimize the amount of electron generation in the inhibited channel, but long enough to allow the program pulse to propagate to the far side of the word line without undue attenuation and spreading. A further issue is that the resistivity of a word line increases with increasing temperature. For example, the resistivity of tungsten can increase by about 50% when the temperature rises from −30 C to 85 C. The total RC delay will therefore also have a 50% increase. Because of this large RC change with temperature, it is desirable for the optimum program pulse duration to be adjusted based on temperature. For example, at relatively high temperatures where the RC delay is significantly longer, the optimum program pulse duration will also become longer. In practice, a minimum allowable program pulse duration can be set to increase with increasing temperature. A program pulse duration which is set to avoid an excessive decrease in channel boosting during the program pulse can be used as the optimum program pulse duration as long as it is no less than the minimum allowable program pulse duration. An optimized program pulse duration can therefore be determined which maximizes channel boosting potential while keeping program disturb at the lowest possible level.

FIG. 13B depicts a program pulse 1400a which includes an initial step up follow by a second step up to a peak value. In some cases, the program pulse has a shape other than a rectangular shape. For example, the pulse may increase in multiple steps or have ramped portions. Here, two steps are used and the duration at the peak level is t00a<t0a. The optimum program pulse duration can be based on the duration at the peak level, or within a specified range of the peak level, in one approach. A program pulse can refer to any type of program waveform in a program loop.

Figure 14A:
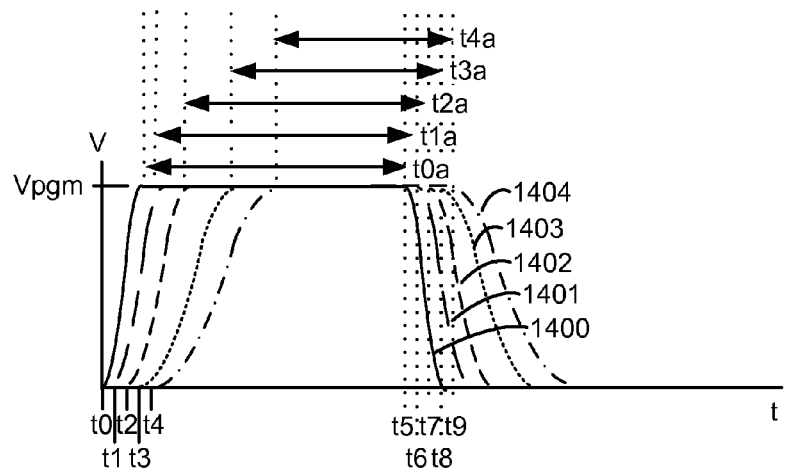
FIG. 14A depicts spreading of a program pulse with a peak duration of t0a at a relatively low temperature.
Figure 14B:
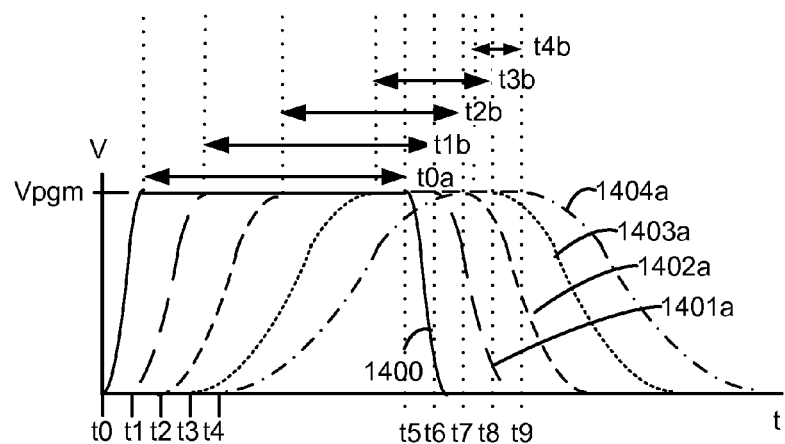
FIG. 14B depicts spreading of a program pulse with a peak duration of t0a at a relatively high temperature.
Figure 14C:
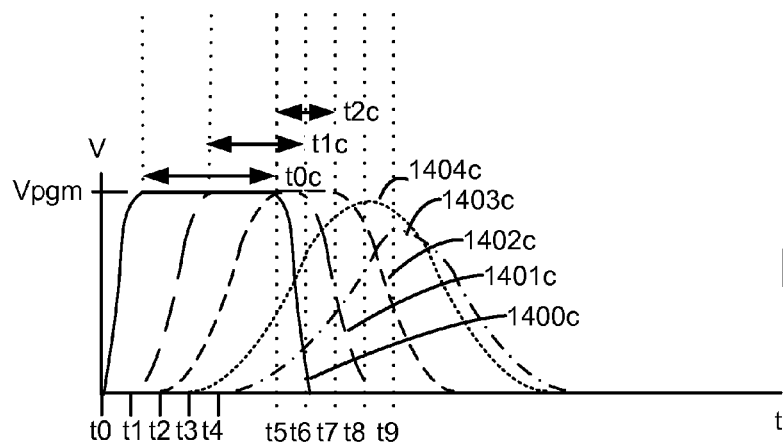
FIG. 14C depicts spreading of a shortened program pulse with a peak duration of t0c<t0a at a relatively high temperature.

In FIG. 14A to 14C, the horizontal axis depicts time and the vertical axis depicts voltage.

FIG. 14A depicts spreading of a program pulse with a peak duration of t0a at a relatively low temperature. The pulses 1400, 1401, 1402, 1403 and 1404 represent a program pulse as it propagates from the near end to the far end of a word line. In this example, the program pulse reaches the peak level of Vpgm at each location along the word line, but is at the peak level for a reduced amount of time as it approaches the far end of the word line. The pulse 1400 increases from 0 V at t0 to a peak level, remains at the peak level for a time period of t0a, then decreases at t5 back to 0 V. In one approach, the duration of the pulse is t0a, the time at which it remains at the peak level, or within some margin of the peak level, e.g., +/−5-20%, for example. The pulse 1401 increases from 0 V at t1 to a peak level, remains at the peak level for a time period of t1a, then decreases at t6 back to 0 V. Similarly, the pulse 1402 increases from 0 V at t2 to a peak level, remains at the peak level for a time period of t2a, then decreases at t7 back to 0 V. The pulse 1403 increases from 0 V at t3 to a peak level, remains at the peak level for a time period of t3a, then decreases at t8 back to 0 V. The pulse 1404 increases from 0 V at t4 to a peak level, remains at the peak level for a time period of t4a, then decreases at t9 back to 0 V. Additionally, t0a>t1a>t2a>t3a>t4a.

FIG. 14B depicts spreading of a program pulse with a peak duration of t0a at a relatively high temperature. As in FIG. 14A, the program pulse reaches the peak level of Vpgm at each location along the word line, but is at the peak level for a reduced amount of time as it approaches the far end of the word line. Due to the relatively high temperature, the attenuation and spreading of the program pulse is relatively significant compared to FIG. 14A. Pulse 1400 at the near end of the word line is the same as in FIG. 14A. Pulses 1401a, 1402a, 1403a and 1404a correspond to pulses 1401, 1402, 1403 and 1404, respectively, in FIG. 14A. Regarding the time scale, t1-t9 are delayed compared to t1-t9 in FIG. 14A due to the increased pulse propagation time at the higher temperature. The pulses 1401a, 1402a, 1403a and 1404a increase from 0 V at t1, t2, t3 and t4, respectively, to the peak level (Vpgm), remain at the peak level for a time period of t1b, t2b, t3b and t4b, respectively, then decrease at t6, t7, t8 and t9, respectively, back to 0 V. Additionally, t0a>t1b>t2b>t3ba>t4b. Further, the duration at the peak level is reduced for the pulses of FIG. 14B compared to FIG. 14A such that t1b<t1a, t2b<t2a, t3b<t3a, and t4b<t4a.

FIG. 14C depicts spreading of a shortened program pulse with a peak duration of t0c<t0a at a relatively high temperature. In contrast to FIGS. 14A and 14B, the program pulse does not reach the peak level of Vpgm at each location along the word line. Waveform 1400c at the near end of the word line is shorter than in FIGS. 14A and 14B. Regarding the time scale, t1-t9 are delayed compared to t1-t9 in FIG. 14A due to the increased pulse propagation time at the higher temperature. The pulses 1400c 1401c and 1402c increase from 0 V at t1, t2 and t3, respectively, to the peak level (Vpgm), remain at the peak level for a time period of t0c, t1c and t2c, respectively, then decrease at t5, t6 and t7, respectively, back to 0 V. However, the pulses 1403c and 1404c are attenuated to the extent that they do not reach Vpgm. The pulses 1403c and 1404c increase from 0 V at t3 and t4, respectively, reach transient peaks which are less than Vpgm and decrease back to 0 V. The duration (t0c) of the program pulse at the near end of the word line in this example is therefore too short because the program pulse at the far end of the word line will be overly attenuated. As a result, additional high-amplitude program pulses will be needed to complete programming of the memory cells at the far end of the word line, leading to increased program disturb for all erased state memory cells on the word line.

Figure 15A:
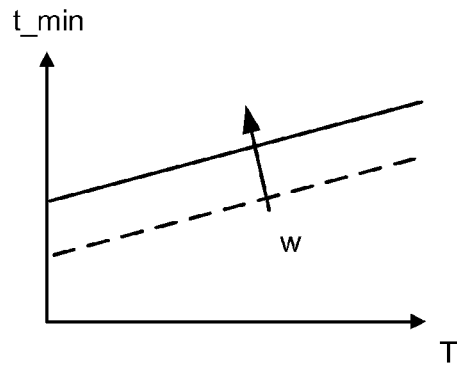
FIG. 15A depicts a plot of a minimum program pulse duration (t_min) as a function of temperature (T) and memory hole width (w).
Figure 15B:
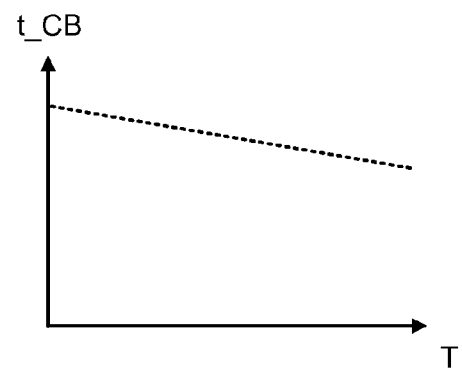
FIG. 15B depicts a plot of a program pulse duration (t_CB) which compensates for a temperature-based reduction in channel boosting as a function of temperature (T).

FIG. 15A depicts a plot of a minimum program pulse duration (t_min) as a function of temperature (T) and memory hole width (w). The horizontal axis depicts temperature (T) and the vertical axis depicts a minimum allowable program pulse duration (t_min). Generally, t_min can increase with temperature to ensure that the program pulse is not too severely attenuated at the far end of the word line. In one approach, t_min is used as a check against a program pulse duration which is determined based on other factors. For example, t_CB in FIG. 15B is a program pulse duration which is reduced with increasing temperature to avoid an excessive decrease in channel boosting. This program pulse duration can be selected as the optimal program pulse duration if it is larger than t_min.

Further, as mentioned, when the portion of a memory hole which is at the same height and adjacent to a selected word line is relatively narrow, the programming operation will tend to conclude with fewer programming pulses. As a result, program disturb is less than when the memory hole is relatively narrow. In this case, it is acceptable to allow a reduced t_min. A method is therefore provided in which a selected word line is in a set of word lines, each word line of the set of word lines is at a different height in the memory device and is adjacent to a portion of a vertical memory hole, a width of the vertical memory hole varies along a height of the memory hole, and the program pulse duration is based on a height of the selected word line in the memory device and is relatively shorter when a portion of the memory hole to which the selected word line is adjacent is relatively narrow.

FIG. 15B depicts a plot of a program pulse duration (t_CB) which compensates for a temperature-based reduction in channel boosting as a function of temperature (T). The horizontal axis depicts temperature (T) and the vertical axis depicts a program pulse duration (t_min). As mentioned, a shorter program pulse duration is desirable when temperature is higher from the standpoint of channel boosting, but this does not consider the increased program pulse attenuation at relatively high temperatures.

Figure 15C:
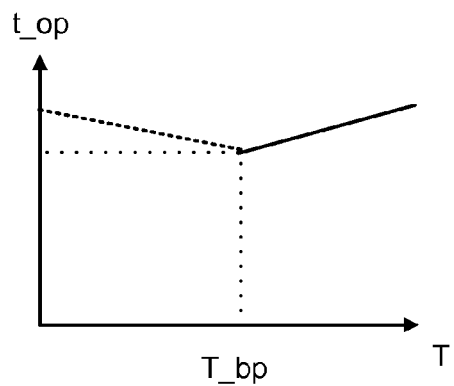
FIG. 15C depicts a plot of an optimized program pulse duration (t_op) based on FIGS. 15A and 15B.

FIG. 15C depicts a plot of an optimized program pulse duration (t_op) based on FIGS. 15A and 15B. The horizontal axis depicts temperature (T) and the vertical axis depicts an optimal program pulse duration (t_op), which is the larger of t-min and t_CB. A temperature T_bp is a breakpoint temperature. For temperatures below T_bp, the program pulse duration increases with a decrease in the temperature and for temperatures above T_bp, the program pulse duration increases with an increase in the tem. T_bp could vary for different word lines in a block.

A related method includes setting the program pulse duration to a larger of the minimum allowable program pulse duration (from FIG. 15A) and another pulse duration (from FIG. 15B), where the another pulse duration is relatively short when the temperature is relatively high and compensates for a temperature-based change in a channel boosting in the memory device.

Figure 15D:
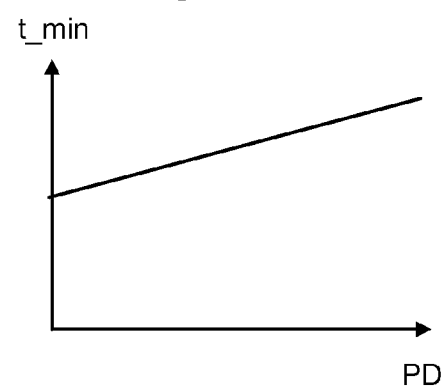
FIG. 15D depicts a plot of a minimum program pulse duration (t_min) as a function of a measurement of program disturb (PD).

FIG. 15D depicts a plot of a minimum program pulse duration (t_min) as a function of a measurement of program disturb (PD). As mentioned, a measure of program disturb can be obtained based on the result of programming one or more previous word lines in a block. For example, a measure of program disturb can comprise a measure of the upper tail of the erased state memory cells, such as a count of erased state memory cells for which Vth>Vv_erase, or a number of errors from ECC decoding of a set of memory cells. This measure can indicate a degree of program disturb that the currently selected word line is likely to experience. For example, if the measure indicates that a previously-programmed word line had a relatively high amount of program disturb, this indicates that the currently selected word line is likely to also have a relatively high amount of program disturb. In this case, t_min can increase with the measure of program disturb to ensure that the program pulse is not too severely attenuated at the far end of the word line.

Figure 15E:
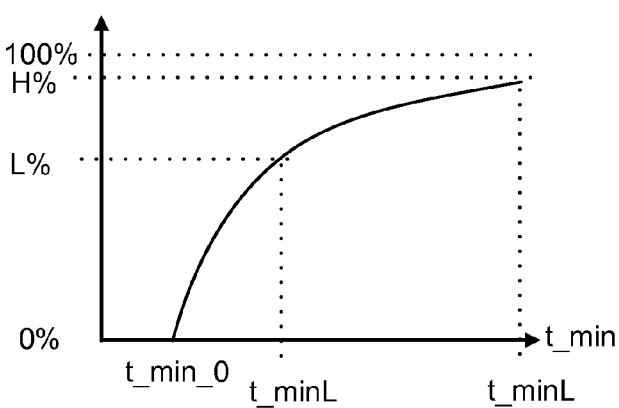
FIG. 15E depicts a plot of a time at peak amplitude for a program pulse at a far memory cell as a percentage of a time at the peak amplitude for the program pulse at a near memory cell, as a function of t_min.

FIG. 15E depicts a plot of a time at peak amplitude for a program pulse at a far memory cell as a percentage of a time at the peak amplitude for the program pulse at a near memory cell, as a function of t_min. The plot can be determined from tests, models or theoretical calculations. Generally, when t_min is at or below a value t_min_0, the percentage on the y-axis is zero, indicating that the program pulse at the far memory cell does not reach the peak amplitude of Vpgm. For example, this situation is exemplified by the pulses of FIG. 14C, where the pulse 1400c is the program pulse at a near memory cell and the pulse 1403c or 1404c is the program pulse at the far memory cell. When t_min=t_minL, the percentage on the y-axis is L %, where L is a number between 0 and 100, indicating that the program pulse at the far memory cell reaches the peak amplitude of Vpgm for L % of the time period in which the program pulse at the near memory cell reaches the peak amplitude of Vpgm. For example, in FIG. 14C, t1c is about 60% of t0c, where L=60. When t_min=t_minH, the percentage on the y-axis is H %, where H>L and H is a number between 0 and 100, indicating that the program pulse at the far memory cell reaches the peak amplitude of Vpgm for H % of the time period in which the program pulse at the near memory cell reaches the peak amplitude of Vpgm. H % is the highest percentage and is close to 100%. For example, H may be 80-99%.

Accordingly, L and H can be set as design parameters and t_minL and t_minH determined from them. The minimum allowable program pulse duration can be set to be t_minL or higher to ensure that the program pulse at the far memory cell reaches the peak amplitude of Vpgm for at least L % of the time period in which the program pulse at the near memory cell reaches the peak amplitude of Vpgm. This ensures that the number of high-amplitude program pulses does not become too great and cause severe program disturb. In practice, the minimum allowable program pulse duration can be set to be t_minL or higher to ensure that the program pulse at the far memory cell reaches within a range of, e.g., +/−5-20% of the peak amplitude of Vpgm for at least L % of the time period in which the program pulse at the near memory cell reaches the range of the peak amplitude of Vpgm.

In a related method, the program pulses are provided on the selected word line by driving one end of the selected word line, each program pulse has a peak amplitude for a time period at the one end of the selected word line, and the minimum allowable program pulse duration is sufficiently long to ensure that the program pulses are within a specified range (e.g., +/−5-20%) of the peak amplitude for at least a specified percentage of the time period when the program pulses reach a memory cell of the set of memory cells which is furthest from the one end of the selected word line.

The plot can be determined from tests, models or theoretical calculations.

Figure 16A:
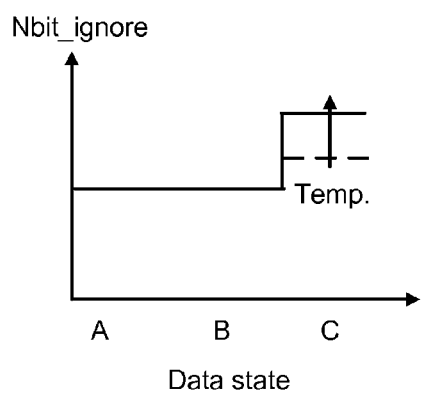
FIG. 16A depicts a plot of Nbit_ignore as a function of data state, where there are three target data states and Nbit_ignore is a function of temperature for a highest target data state, and Nbit_ignore is elevated at any temperature for the highest target data state.

FIG. 16A depicts a plot of Nbit_ignore as a function of data state, where there are three target data states and Nbit_ignore is a function of temperature for a highest target data state, and Nbit_ignore is elevated at any temperature for the highest target data state. As mentioned, Nbit_ignore is a number of bits or memory cells which can fail a verify test while still successfully concluding a programming operation. For the C state, the dashed line is the case for the lowest temperature and the solid line is the case for the highest temperature. Since the dashed line for the C state is above the solid lines for the A and B state, Nbit_ignore is always higher for the C state. This condition serves to lower the number of high-amplitude program pulses needed to complete programming of the C state memory cells at all temperatures, including the worst case of the highest temperature.

In this example, a set of memory cells comprises memory cells which are to be programmed to a highest target data state (e.g., C state) of a plurality of target data states by the programming. A related method comprises adjusting a bit ignore number for the highest target data state based on the temperature, wherein the bit ignore number is relatively high when the temperature is relatively high, and the bit ignore number is a number of the memory cells which are to be programmed to the highest target data state which are permitted to fail a verify test of the highest target data state while still allowing the programming to be successfully completed.

The set of memory cells comprises memory cells which are to be programmed to a target data state (e.g., A or B) below the highest target data state, and a bit ignore number for the memory cells which are to be programmed to the target data state below the highest target data state is not adjusted based on the temperature. Further, the bit ignore number for the memory cells which are to be programmed to the target data state below the highest target data state is a number of the memory cells which are to be programmed to the target data state below the highest target data state which are permitted to fail a verify test of the target data state below the highest target data state while still allowing the programming to be successfully completed.

Figure 16C:
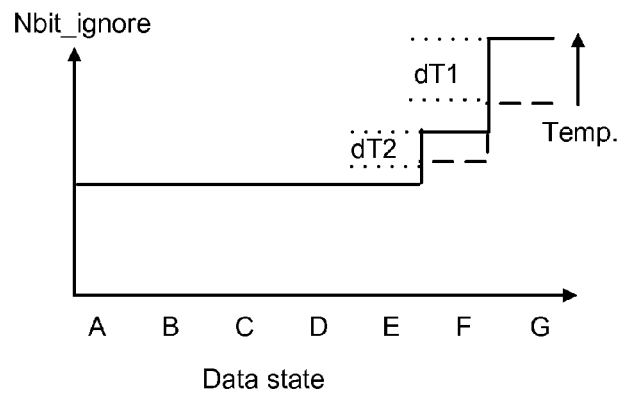
FIG. 16C depicts a plot of Nbit_ignore as a function of data state, where there are seven target data states and Nbit_ignore is a function of temperature for the first and second highest target data states, and Nbit_ignore is elevated at any temperature for the first and second highest target data states.
Figure 16B:
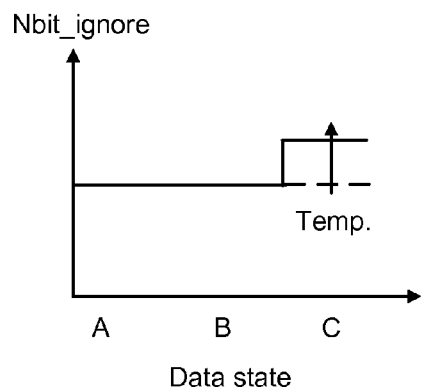
FIG. 16B depicts a plot which is a variation to FIG. 16A in that Nbit_ignore is not elevated at a lowest temperature.

FIG. 16B depicts a plot which is a variation to FIG. 16A in that Nbit_ignore is not elevated at a lowest temperature. For the C state, the dashed line is the case for the lowest temperature and the solid line is the case for the highest temperature. Since the dashed line for the C state is equal to the solid lines for the A and B state, Nbit_ignore is the same for the C state at the lowest temperature as for the A and B states. This is a default number. This condition addresses the worst case of the highest temperature while avoiding a broadening of the threshold voltage distribution for the C state memory cells at a lowest temperature.

FIG. 16C depicts a plot of Nbit_ignore as a function of data state, where there are seven target data states and Nbit_ignore is a function of temperature for the first and second highest target data states, and Nbit_ignore is elevated at any temperature for the first and second highest target data states. This approach helps reduce program disturb which is caused by programming of memory cells to a relatively high target data state (e.g., F state) which is below the highest target data state (e.g., G state). This is in addition to reducing program disturb which is caused by programming of memory cells to the highest target data state, as shown, e.g., in FIGS. 16A and 16B. For the F and G states, the dashed lines represent Nbit_ignore for the lowest temperature and the solid lines represent Nbit_ignore for the highest temperatures. For the other target data states, the solid lines represent Nbit_ignore. In this example, a smaller temperature-based increase in Nbit_ignore is provided for the F state than for the G state due to the somewhat smaller likelihood of program disturb due to programming of the F state memory cells compared to the G state memory cells. Generally, a temperature-based increase of Nbit_ignore can be provided in proportion to the target data state, e.g., in proportion to the verify voltage of the target data state.

In another approach, an equal temperature-based increase in Nbit_ignore is provided for both the F and G states.

As an example, Nbit-ignore could be 5% of the memory cells of a given target data state, for the A-E states, 7% for the memory cells of the F state, and 10% for the memory cells of the G state.

In a related method, a set of memory cells comprises memory cells which are to be programmed to a second highest target data state (e.g., F state) of a plurality of target data states, a bit ignore number for the memory cells which are to be programmed to the second highest target data state is adjusted based on the temperature by a smaller amount (dT2) than an amount (dT1) to which the bit ignore number is adjusted for the memory cells which are to be programmed to the highest target data state, and the bit ignore number for the memory cells which are to be programmed to the second highest target data state is a number of the memory cells which are to be programmed to the second highest target data state which are permitted to fail a verify test of the second highest target data state while still allowing the programming to be successfully completed.

Figure 16D:
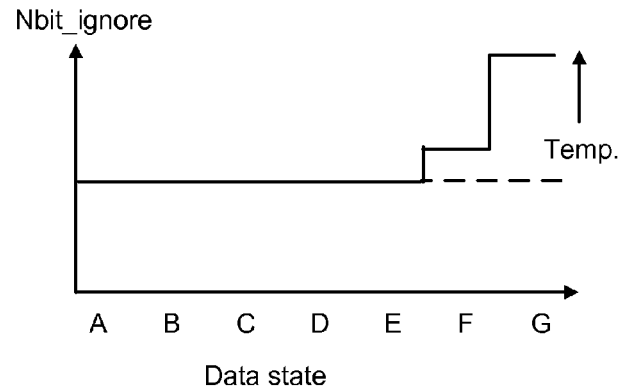
FIG. 16D depicts a plot which is a variation to FIG. 16A in that Nbit_ignore is not elevated at a lowest temperature for the first and second highest target data states.

FIG. 16D depicts a plot which is a variation to FIG. 16A in that Nbit_ignore is not elevated at a lowest temperature for the first and second highest target data states. The dashed lines for the F and G states are equal to the solid lines of the other target data states, so that a common Nbit_ignore is used for all data state at the lowest temperature. Further, at the highest temperature, Nbit_ignore is stepped up more for the G state than the F state, as in FIG. 16C, in one approach.

In FIG. 16A-16D, Nbit_ignore can be set to an intermediate level for intermediate temperatures which are between the lowest and highest temperatures which are sensed by the memory device. In an alternative or additional approach, Nbit_ignore is set higher for one or more highest target data states in proportion to a measure of program disturb. In an alternative or additional approach, Nbit_ignore is set higher for one or more highest target data states in proportion to the width (w) of the memory hole of the currently selected word line.

Figure 17:
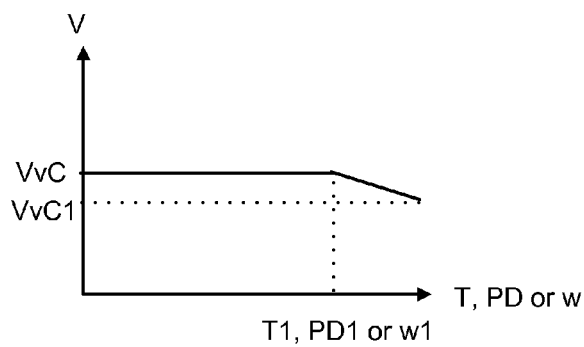
FIG. 17 depicts a plot of a verify voltage (VvC) for a highest target data state as a function of temperature (T), program disturb (PD) or memory hole width (w).

FIG. 17 depicts a plot of a verify voltage (VvC) for a highest target data state as a function of temperature (Temp.), program disturb (PD) or memory hole width (w). As mentioned, when these parameters are relatively high, there is an increased likelihood of program disturb. In one approach, the verify voltage is fixed at Vvc (a default verify voltage) for lower values of these parameters. Once these parameters exceed a specified level referred to as T1, PD1 or w1, the verify voltage ramps down, approaching Vvc1, as the parameter increases (FIG. 10C). In another approach, the verify voltage steps down in one or more steps as the parameter increases.

FIGS. 16A-16D and 17 demonstrate how program disturb can be reduced by easing the requirements of a verify test for one or more highest data states.

Accordingly, it can be seen that, in one embodiment, a method for operating a memory device comprises: obtaining data indicating a temperature of the memory device; determining a program pulse duration which is at least as long as a minimum allowable program pulse duration, the minimum allowable program pulse duration is relatively long when the temperature is relatively high and compensates for a temperature-based change in a time constant of a selected word line in the memory device; and programming a set of memory cells connected to the selected word line using program pulses having the program pulse duration.

In another embodiment, a memory device comprises: a set of memory cells connected to a selected word line; a driver at one end of the selected word line; and a control circuit. The control circuit is configured to: obtain data indicating a temperature of the memory device; set a program pulse duration based on the temperature, wherein for temperatures below a breakpoint temperature, the program pulse duration increases with a decrease in the temperature and for temperatures above the breakpoint temperature, the program pulse duration increases with an increase in the temperature; and program a set of memory cells connected to the selected word line using program pulses having the program pulse duration.

In another embodiment, a memory controller comprises: a storage device comprising a set of instructions and a processor operable to execute the set of instructions. The set of instructions comprises: instructions to obtain data indicating a temperature; instructions to determine a minimum allowable program pulse duration based on the data, the minimum allowable program pulse duration is relatively long when the temperature is relatively high; instructions to determine a program pulse duration which is at least as long as the minimum allowable program pulse duration; and instructions to program a set of memory cells connected to a selected word line using program pulses having the program pulse duration; and In another embodiment, a memory device comprises: a set of memory cells connected to a selected word line; a driver at one end of the selected word line; a temperature-sensing component; and a control circuit. The control circuit is configured to: obtain data indicating a temperature of the memory device from the temperature-sensing component; determine a program pulse duration which is at least as long as a minimum allowable program pulse duration, the minimum allowable program pulse duration is relatively long when the temperature is relatively high and compensates for a temperature-based change in a time constant of a selected word line in the memory device; and program a set of memory cells connected to the selected word line using program pulses having the program pulse duration.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for operating a memory device, comprising:
obtaining data indicating a temperature of the memory device;
determining a program pulse duration which is at least as long as a minimum allowable program pulse duration, the minimum allowable program pulse duration is relatively long when the temperature is relatively high and compensates for a temperature-based change in a time constant of a selected word line in the memory device;
programming a set of memory cells connected to the selected word line using program pulses having the program pulse duration, wherein the set of memory cells comprises memory cells which are to be programmed to a highest target data state of a plurality of target data states by the programming; and adjusting a bit ignore number for the highest target data state based on the temperature, wherein the bit ignore number is relatively high when the temperature is relatively high, and the bit ignore number is a number of the memory cells which are to be programmed to the highest target data state which are permitted to fail a verify test of the highest target data state while still allowing the programming to be successfully completed.

2. The method of claim 1, wherein:
for temperatures below a breakpoint temperature, the program pulse duration increases with a decrease in the temperature; and
for temperatures above the breakpoint temperature, the program pulse duration increases with an increase in the temperature.

3. The method of claim 1, further comprising:
setting the program pulse duration to a larger of the minimum allowable program pulse duration and another pulse duration, the another pulse duration is relatively short when the temperature is relatively high and compensates for a temperature-based change in a channel boosting in the memory device.

4. The method of claim 1, wherein:
the selected word line is in a set of word lines;
each word line of the set of word lines is at a different height in the memory device and is adjacent to a portion of a vertical memory hole;
a width of the vertical memory hole varies along a height of the memory hole; and
the program pulse duration is based on a height of the selected word line in the memory device and is relatively short when a portion of the memory hole to which the selected word line is adjacent is relatively narrow.

5. The method of claim 1, wherein:
the set of memory cells comprises memory cells which are to be programmed to a target data state below the highest target data state; and
a bit ignore number for the memory cells which are to be programmed to the target data state below the highest target data state is not adjusted based on the temperature; and
the bit ignore number for the memory cells which are to be programmed to the target data state below the highest target data state is a number of the memory cells which are to be programmed to the target data state below the highest target data state which are permitted to fail a verify test of the target data state below the highest target data state while still allowing the programming to be successfully completed.

6. The method of claim 1, wherein:
the set of memory cells comprises memory cells which are to be programmed to a second highest target data state of the plurality of target data states; and
a bit ignore number for the memory cells which are to be programmed to the second highest target data state is adjusted based on the temperature by a smaller amount than an amount to which the bit ignore number is adjusted for the memory cells which are to be programmed to the highest target data state; and
the bit ignore number for the memory cells which are to be programmed to the second highest target data state is a number of the memory cells which are to be programmed to the second highest target data state which are permitted to fail a verify test of the second highest target data state while still allowing the programming to be successfully completed.

7. The method of claim 1, wherein the set of memory cells comprises memory cells which are to be programmed to a highest target data state of a plurality of target data states by the programming, and the method further comprises:
adjusting a verify voltage for the highest target data state based on the temperature, wherein the verify voltage is relatively low when the temperature is relatively high.

8. The method of claim 1, wherein:
the program pulses are provided on the word line by driving one end of the selected word line;
each program pulse has a peak amplitude at the one end of the selected word line; and
the minimum allowable program pulse duration is sufficiently long to ensure that the program pulses are within a specified range of the peak amplitude when the program pulses reach a memory cell of the set of memory cells which is furthest from the one end of the selected word line.

9. The method of claim 1, wherein:
the program pulses are provided on the selected word line by driving one end of the selected word line;
each program pulse has a peak amplitude for a time period at the one end of the selected word line; and
the minimum allowable program pulse duration is sufficiently long to ensure that the program pulses are within a specified range of the peak amplitude for at least a specified percentage of the time period when the program pulses reach a memory cell of the set of memory cells which is furthest from the one end of the selected word line.

10. The method of claim 1, further comprising:
determining a number of errors in programming a set of memory cells connected to another word line; and
setting the minimum allowable program pulse duration to be relatively long when the number of errors is relatively high.

11. The method of claim 1, further comprising:
determining a measure of program disturb in programming a set of memory cells connected to another word line; and
setting the minimum allowable program pulse duration to be relatively long when the measure of program disturb is relatively high, wherein the measure of program disturb is based on a measurement of an upper tail of a threshold voltage distribution of erased state memory cells in the set of memory cells connected to the another word line.

12. The method of claim 11, wherein:
the measurement of the upper tail is based on a number of memory cells in the set of memory cells connected to another word having a threshold voltage above a demarcation voltage.

13. A memory device, comprising:
a set of memory cells connected to a selected word line;
a driver at one end of the selected word line; and
a control circuit, the control circuit is configured to:
obtain data indicating a temperature of the memory device;
set a program pulse duration based on the temperature, wherein for temperatures below a breakpoint temperature, the program pulse duration increases with a decrease in the temperature and for temperatures above the breakpoint temperature, the program pulse duration increases with an increase in the temperature; and
program a set of memory cells connected to the selected word line using program pulses having the program pulse duration.

14. The memory device of claim 13, wherein the set of memory cells comprises memory cells which are to be programmed to a highest target data state of a plurality of target data states by the programming, and the control circuit is configured to:
adjust a bit ignore number for the highest target data state based on the temperature, wherein the bit ignore number is relatively high when the temperature is relatively high, and the bit ignore number is a number of the memory cells which are to be programmed to the highest target data state which are permitted to fail a verify test of the highest target data state while still allowing the programming to be successfully completed.

15. The memory device of claim 13, wherein:
the control circuit, to provide the program pulses on the word line, are configured to drive one end of the selected word line;
each program pulse has a peak amplitude at the one end of the selected word line; and
a minimum allowable program pulse duration is sufficiently long to ensure that the program pulses are within a specified range of the peak amplitude when the program pulses reach a memory cell of the set of memory cells which is furthest from the one end of the selected word line.

16. The memory device of claim 13, wherein:
the control circuit is configured to determine a measure of program disturb in programming a set of memory cells connected to another word line and set a minimum allowable program pulse duration to be relatively long when the measure of program disturb is relatively high; and
the measure of program disturb is based on a measurement of an upper tail of a threshold voltage distribution of erased state memory cells in the set of memory cells connected to the another word line.

17. A method for operating a memory device, comprising:
obtaining data indicating a temperature of the memory device;
determining a program pulse duration which is at least as long as a minimum allowable program pulse duration, the minimum allowable program pulse duration is relatively long when the temperature is relatively high and compensates for a temperature-based change in a time constant of a selected word line in the memory device; and
programming a set of memory cells connected to the selected word line using program pulses having the program pulse duration, wherein:
the selected word line is in a set of word lines;
each word line of the set of word lines is at a different height in the memory device and is adjacent to a portion of a vertical memory hole;
a width of the vertical memory hole varies along a height of the memory hole; and
the program pulse duration is based on a height of the selected word line in the memory device and is relatively short when a portion of the memory hole to which the selected word line is adjacent is relatively narrow.

* * * * *